United States Patent
Choo et al.

(10) Patent No.: US 10,714,554 B2
(45) Date of Patent: Jul. 14, 2020

(54) ELECTROLUMINESCENT DISPLAY DEVICE INTEGRATED WITH IMAGE SENSOR

(71) Applicant: LG DISPLAY CO., LTD., Seoul (KR)

(72) Inventors: Kyoseop Choo, Suwon-si (KR); Guensik Lee, Seoul (KR); Manhyeop Han, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/807,295

(22) Filed: Nov. 8, 2017

(65) Prior Publication Data

US 2018/0151656 A1    May 31, 2018

(30) Foreign Application Priority Data

Nov. 25, 2016    (KR) .................. 10-2016-0158469

(51) Int. Cl.
*G09G 3/3233* (2016.01)
*G09G 3/3291* (2016.01)
*H01L 27/32* (2006.01)

(52) U.S. Cl.
CPC ....... *H01L 27/3262* (2013.01); *G09G 3/3233* (2013.01); *G09G 3/3291* (2013.01); *H01L 27/3213* (2013.01); *H01L 27/3265* (2013.01); *G09G 2300/0819* (2013.01); *G09G 2300/0842* (2013.01); *G09G 2300/0861* (2013.01); *G09G 2310/0256* (2013.01);
(Continued)

(58) Field of Classification Search
CPC ............. H01L 27/3262; H01L 27/3265; H01L 27/3213; H01L 2227/323; H01L 27/32; G09G 3/3233; G09G 3/3291; G09G 2300/0842; G09G 2320/0295; G09G 2310/0256; G09G 2300/0819; G09G 2300/0861; G09G 2320/04; G09G 3/3258; G09G 2360/148; G09G 2360/14; G09G 2300/0814; G09G 3/3208; G06F 2203/04109; G06K 9/00006
See application file for complete search history.

(56) References Cited

U.S. PATENT DOCUMENTS

| 5,350,977 | A | * | 9/1994 | Hamamoto | ............ | H05B 37/02 |
| | | | | | | 315/291 |
| 5,448,082 | A | * | 9/1995 | Kim | ................... | H01L 31/1035 |
| | | | | | | 257/101 |
| 5,929,845 | A | | 7/1999 | Wei et al. | | |

(Continued)

FOREIGN PATENT DOCUMENTS

| EP | 2 631 898 A1 | 8/2013 |
| EP | 3 226 174 A1 | 10/2017 |

(Continued)

*Primary Examiner* — Chad M Dicke
(74) *Attorney, Agent, or Firm* — Seed Intellectual Property Law Group LLP

(57) ABSTRACT

Disclosed is an electroluminescent display device integrated with image sensors, including: a display panel having a plurality of pixels; a display panel driving circuit configured to write data of an input image into the pixels during a display mode so as to display the input image with the pixels; and a sensor processing circuit configured to apply a reverse bias to Organic Light Emitting Diodes (OLEDs) disposed in at least some of the pixels during a sensor mode so as to process sensor signals received from the pixels.

17 Claims, 19 Drawing Sheets

(52) U.S. Cl.
CPC . *G09G 2320/0295* (2013.01); *G09G 2320/04* (2013.01); *H01L 2227/323* (2013.01)

(56) References Cited

U.S. PATENT DOCUMENTS

| | | | | |
|---|---|---|---|---|
| 6,295,403 | B1* | 9/2001 | Takeuchi | G02B 6/0043 385/128 |
| 6,608,657 | B2* | 8/2003 | Hiyama | G02B 6/0033 349/62 |
| 7,230,603 | B2* | 6/2007 | Yamamoto | G02B 6/0055 345/102 |
| 7,859,526 | B2* | 12/2010 | Konicek | G06K 9/0004 345/156 |
| 8,380,026 | B2* | 2/2013 | Van Ostrand | G02B 6/00 359/291 |
| 8,760,600 | B2* | 6/2014 | Verslegers | G02B 6/0065 349/61 |
| 8,831,387 | B2* | 9/2014 | Nakai | G02B 6/0006 385/147 |
| 8,941,631 | B2* | 1/2015 | Khazeni | G02B 6/0038 257/59 |
| 9,176,342 | B2* | 11/2015 | Ostergaard | G02B 6/001 |
| 9,335,556 | B2* | 5/2016 | Travis | G02F 1/1323 |
| 9,741,290 | B1* | 8/2017 | Lee | G09G 3/3233 |
| 10,012,844 | B2* | 7/2018 | Travis | G02F 1/1323 |
| 10,031,631 | B2* | 7/2018 | Kanna | B32B 7/02 |
| 10,067,347 | B2* | 9/2018 | Vallius | G02B 6/0016 |
| 10,134,337 | B2* | 11/2018 | Lee | G09G 3/3258 |
| 2003/0122749 | A1* | 7/2003 | Booth, Jr. | G09G 3/3208 345/82 |
| 2005/0083270 | A1* | 4/2005 | Miyazawa | G09G 3/3233 345/76 |
| 2005/0200291 | A1* | 9/2005 | Naugler, Jr. | G06F 3/0412 315/149 |
| 2005/0219229 | A1* | 10/2005 | Yamaguchi | G06F 3/0412 345/173 |
| 2009/0167648 | A1* | 7/2009 | Jeon | G09G 3/3233 345/76 |
| 2012/0092293 | A1 | 4/2012 | Ganapathi et al. | |
| 2012/0257282 | A1* | 10/2012 | Hudman | G02B 5/04 359/619 |
| 2012/0306940 | A1* | 12/2012 | Machida | G02B 6/005 345/690 |
| 2013/0021300 | A1 | 1/2013 | Wassvik | |
| 2013/0051730 | A1* | 2/2013 | Travers | G02B 27/01 385/37 |
| 2013/0069552 | A1* | 3/2013 | Aurongzeb | G09G 3/3216 315/224 |
| 2014/0168260 | A1* | 6/2014 | O'Brien | G09G 5/377 345/633 |
| 2015/0302793 | A1* | 10/2015 | In | G09G 3/3208 345/211 |
| 2015/0348504 | A1* | 12/2015 | Sakariya | G09G 3/3233 345/206 |
| 2015/0356919 | A1* | 12/2015 | Wang | G09G 3/3266 345/690 |
| 2015/0364107 | A1* | 12/2015 | Sakariya | G06F 3/0412 345/174 |
| 2016/0018658 | A1* | 1/2016 | Machida | G02B 6/005 345/207 |
| 2016/0125808 | A1* | 5/2016 | Hsu | G09G 3/3233 345/212 |
| 2016/0147003 | A1* | 5/2016 | Morozov | G02B 6/0023 359/11 |
| 2016/0232849 | A1* | 8/2016 | Jeon | G09G 3/3233 |
| 2017/0059961 | A1* | 3/2017 | Park | G02F 1/31 |
| 2017/0131545 | A1* | 5/2017 | Wall | G02B 27/0101 |
| 2017/0193897 | A1* | 7/2017 | Zhang | H01L 51/56 |
| 2017/0208655 | A1* | 7/2017 | Lee | G01R 1/30 |
| 2017/0236463 | A1* | 8/2017 | Chi | G02B 27/141 345/694 |
| 2018/0084245 | A1* | 3/2018 | Lapstun | G02B 27/0075 |
| 2018/0246581 | A1* | 8/2018 | Omata | G06F 3/044 |
| 2018/0299678 | A1* | 10/2018 | Singer | G02B 5/1819 |
| 2019/0114032 | A1* | 4/2019 | Trefonas, III | G06F 3/0412 |

FOREIGN PATENT DOCUMENTS

| | | |
|---|---|---|
| KR | 10-2009-0104319 A | 10/2009 |
| KR | 10-2016-0055757 A | 5/2016 |
| KR | 10-2016-0128076 A | 11/2016 |
| WO | 2015/108477 A1 | 7/2015 |

* cited by examiner (A)

(B)

(C)

(D)

SLS $T_{CP\_AIR} < \alpha < T_{VHOE\_LR} < \theta$ ex) $45° < \alpha < 55°$
$70° < \theta < 75°$

ELECTROLUMINESCENT DISPLAY DEVICE INTEGRATED WITH IMAGE SENSOR

This application claims the benefit of Korean Patent Application No. 10-2016-0158469 filed on Nov. 25, 2016, the entire contents of which is incorporated herein by reference for all purposes as if fully set forth herein.

BACKGROUND

Technical Field

The present disclosure relates to an electroluminescent display device integrated with image sensors, the display device in which any loss of the aperture ratio of pixels does not occur.

Description of the Related Art

Depending on a material of an emission layer, electroluminescent display devices are classified into inorganic light emitting display devices and organic light emitting display devices. An active matrix-type organic light emitting display device includes an Organic Light Emitting Diode (OLED) which is a self-emitting element, and has advantages such as a quick response time, high emission efficiency, excellent brightness, and a wide viewing angle.

An OLED in the organic light emitting display includes an anode, a cathode, and an organic compound layer. The organic compound layer includes a hole injection layer HIL, a hole transport layer HTL, an emission layer EML, an electron transport layer ETL, and an electron injection layer EIL. When a voltage is applied to the anode electrode and the cathode electrode, holes passing through the HTL and electrons passing through the ETL move into the EML to form excitons, causing the EML to emit visible light.

Efforts are being made to study a method of embedding an image sensor in a display device. The image sensor includes a plurality of photo sensors. Such a display device is usually implemented in a manner in which additional photo sensors are distributed within the pixel array. In this method, the photo sensors do not operate as pixels, and thus, this may result in a reduction in the aperture ratio of a pixel in the pixel array. In the case of a high resolution display device, the size of a pixel is reduced as much as an area occupied by a photo sensor. Therefore, in this case, it is difficult to design pixels and secure manufacturing process margin.

BRIEF SUMMARY

The present disclosure provides an electroluminescent display device which is able to implement an image sensor within a pixel array without any loss of the aperture ratio of a pixel.

In one general aspect of the present disclosure, there is provided an electroluminescent display device, including: a display panel having a plurality of pixels, each of the pixels including an Organic Light Emitting Diode (OLED); a display panel driving circuit configured to write data of an input image into the pixels during a display mode so as to display the input image with the pixels; and a sensor processing circuit configured to apply a reverse bias to OLEDs of at least some of the pixels during a sensor mode so as to process sensor signals received from the pixels.

The sensor processing circuit may increase a cathode voltage of the OLEDs in the sensor mode.

In the display mode, a threshold voltage of a driving element formed in each of the pixels may be sampled during a display mode programming period. In the sensor mode, a sensor mode programming period may be divided into a first period, in which a sensor signal is charged in capacitors connected to anodes of the OLEDs, and a second period, in which the signal charged in the capacitors is transmitted to the sensor signal processing circuit.

The display mode programming period and the sensor mode programming period may have a same duration during one horizontal period.

In the sensor mode, OLEDs of a first portion of pixels arranged in a sensing area of the display panel may emit light in response to a forward bias to thereby operate as light source pixels, and OLEDs of a second portion of pixels arranged in the sensing area may operate as sensor pixels in response to a reverse bias.

The locations of the light source pixels and the sensor pixels may shift temporally.

The pixels may be divided into M×N pixel groups (each of M and N is a positive integer equal to or greater than 3). A pixel located at a central region of a M×N pixel group may operate as a sensor pixel, and pixels surrounding the sensor pixel may operate as the light source pixels. The locations of the M×N pixel groups may shift temporally.

The electroluminescent display device may further include: a transparent substrate disposed on the display panel; a light source disposed along an edge of the transparent substrate; a light entrance element disposed between the light source and the transparent substrate, and configured to refract incident light into the transparent substrate as propagating light at a total reflectance angle; a light exit element disposed on a same plane as the light entrance element, and configured to refract part of the propagating light in the transparent substrate toward the display panel through a bottom surface of the transparent substrate; and a low refractive layer disposed between the light exit element and the display panel, and having a refractive index smaller than a refractive index of the light exit element.

A reverse bias may be applied to all pixels on the display panel in the sensor mode.

The pixels may sense at least one of a fingerprint pattern or a document image in the sensor mode.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
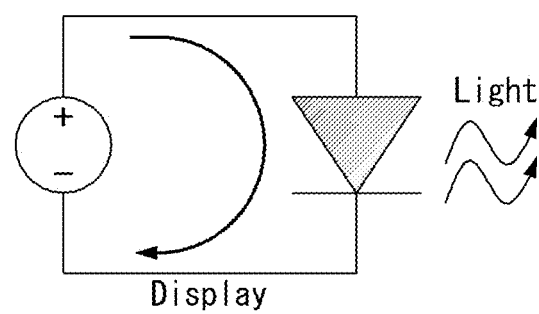
FIG. 1 is a diagram schematically illustrating an example in which an Organic Light Emitting Diode emits light when a forward bias is applied.

Advantages and features of the present disclosure and methods to achieve them will become apparent from the descriptions of exemplary embodiments herein below with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, numbers of elements given in the drawings are merely illustrative and thus the present disclosure is not limited to what is shown in the drawings. Like reference numerals denote like elements throughout the descriptions. Further, in describing the present disclosure, descriptions on well-known technologies may be omitted in order not to obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g., "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B" and "an element A next to an element B," another element C may be disposed between the elements A and B unless the term "directly" or "immediately" is explicitly used.

The terms first, second, third and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present disclosure.

Features of various exemplary embodiments of the present disclosure may be combined partially or totally. As will be clearly appreciated by those skilled in the art, technically various interactions and operations are possible. Various exemplary embodiments can be practiced individually or in combination.

Hereinafter, various embodiments of the present disclosure will be described with accompanying drawings. In the embodiments, an electroluminescent display device is described by taking an example of an organic light emitting display device including organic light emitting materials. However, the technical idea of the present disclosure is not limited to the organic light emitting display device, and may be applied to an inorganic light emitting display device including inorganic light emitting materials.

In an electroluminescent display device according to the present disclosure, pixels and a gate driver include a plurality of transistors. On a substrate of a display panel, a transistor may be implemented as a Thin Film Transistor (TFT). A transistor is a three-electrode element including a gate, a source, and a drain. The source is an electrode for supplying a carrier to the transistor. In the transistor, a carrier flows from the source. The drain is an electrode from which the carrier flows to the outside. That is, In a MOSFET, a carrier flow starts from the source to the drain. In the case of a n-type MOSFET (NMOS), a carrier is an electron, and thus a source voltage is lower than a drain voltage so that the electron flows from the source to the drain. In the case of the n-type MOSFET, a carrier flows from the source to the drain, and thus, a direction of currents is from the drain to the source. In the case of a p-type MOSFET (PMOS), a carrier is a hole, and thus, a source voltage is higher than a drain voltage so that the hole flows from the source to the drain. In the case of the p-type MOSFET, a hole flows from the source to the drain, and thus, a current flows from the source to the drain. The source and drain of an MOSFET is not fixed. For example, the source and drain of an MOSFET may be changed depending on an applied voltage. In the following description, a source and a drain of the transistor are not used to restrict the present disclosure.

Figure 2:
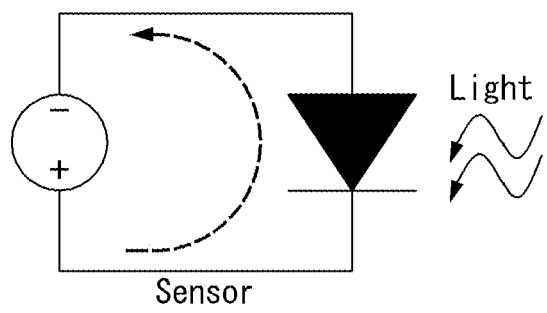
FIG. 2 is a diagram schematically illustrating an example in which an Organic Light Emitting Diode emits light when a reverse bias is applied.

As illustrated in FIG. 1, when a forward bias voltage is applied to an Organic Light Emitting Diode (OLED), the OLED emits light. On the contrary, as illustrated in FIG. 2, if light is emitted to the OLED when a reverse bias voltage is applied to the OLED, it leads to a photo current to occur. The present disclosure adjusts a voltage applied to an OLED formed in a pixel of a display device so as to utilize the pixel as a photo sensor. Thus, the present disclosure may implement an electroluminescent display device integrated with image sensors, without additional photo sensors arranged in a pixel array. Since the present disclosure is able to implement an image sensor without adding an additional photo sensor in the pixel array, it is possible to secure a sufficient manufacturing process margin and remove the design limitation caused by an increase in resolution.

Figure 3:
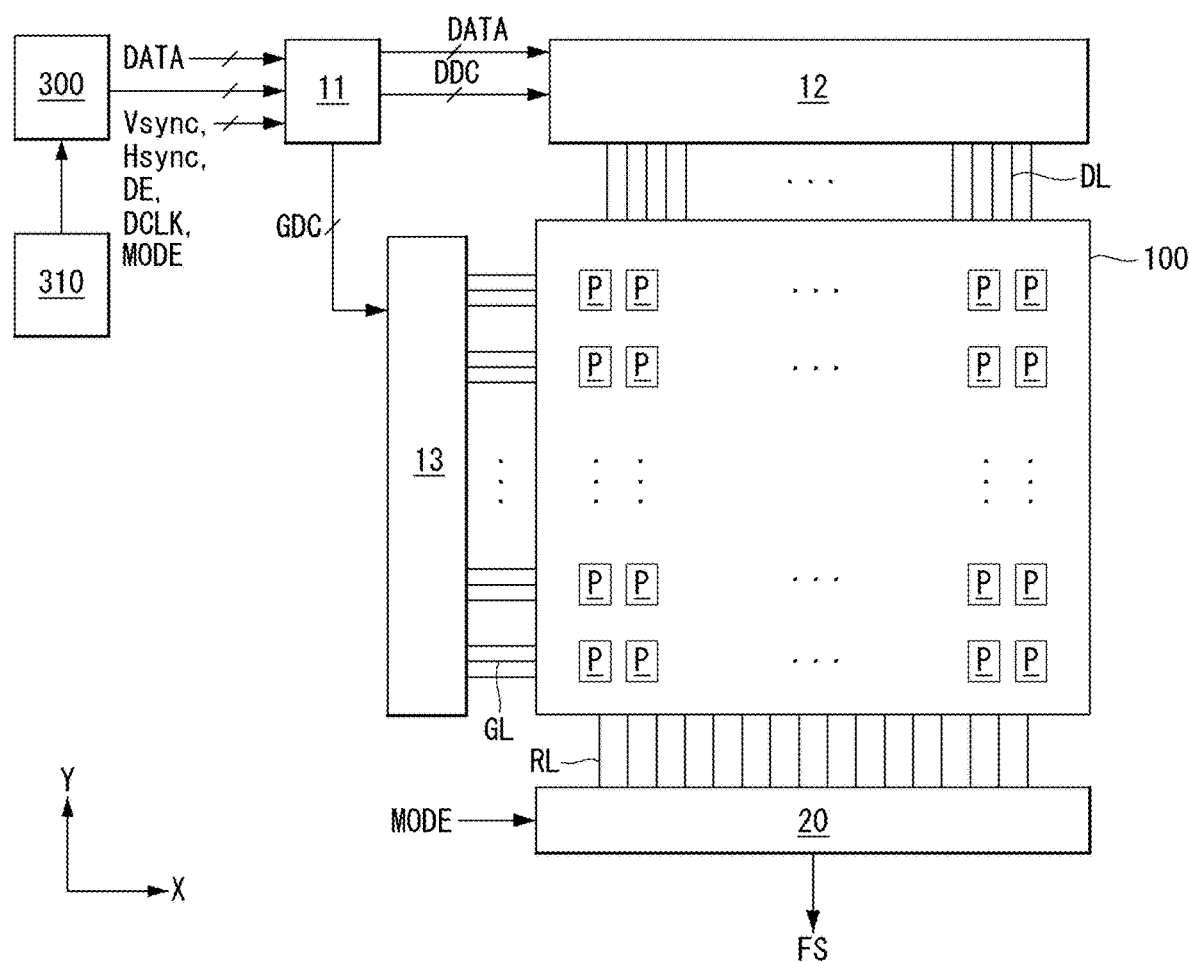
FIG. 3 is a block diagram illustrating an electroluminescent display device according to a first embodiment of the present disclosure.

FIG. 3 is a block diagram illustrating an electroluminescent display device according to a first embodiment of the present disclosure.

Referring to FIG. 3, an electroluminescent display device according to an embodiment of the present disclosure includes a display panel 100, a display panel driving circuit 12 and 13, a sensor signal processing circuit 20, and a timing controller 11.

The display panel 100 includes a pixel array which represents an input image. The pixel array includes a plurality of data lines DL, a plurality of gate lines GL intersecting with the data lines DL, and pixels P arranged in matrix. In FIG. 3, "RL" denotes a Vref line. The Vref line RL is connected to a sensing channel of the sensor signal processing circuit 20 in a sensor mode. The pixels P may be divided into red sub-pixels R, green sub-pixels G, and blue sub-pixels B, and may further include white sub-pixels W. Each subpixel includes an OLED as the same as a pixel circuit shown in FIG. 4.

Figure 4:
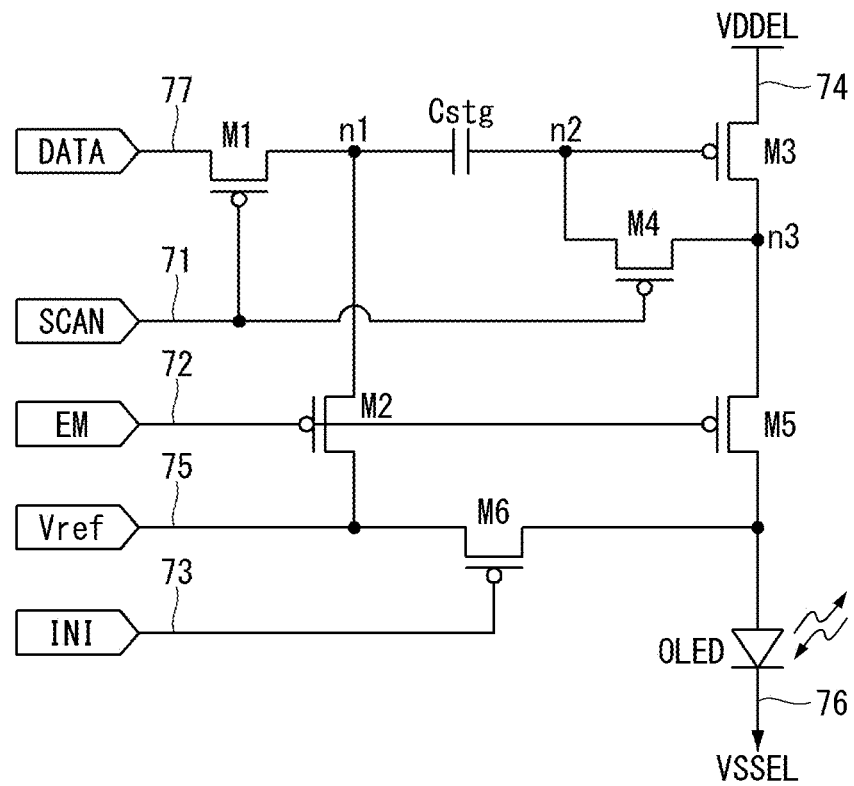
FIG. 4 is a circuit diagram and corresponding waveform diagram illustrating an example of a pixel circuit.
Figure 4:
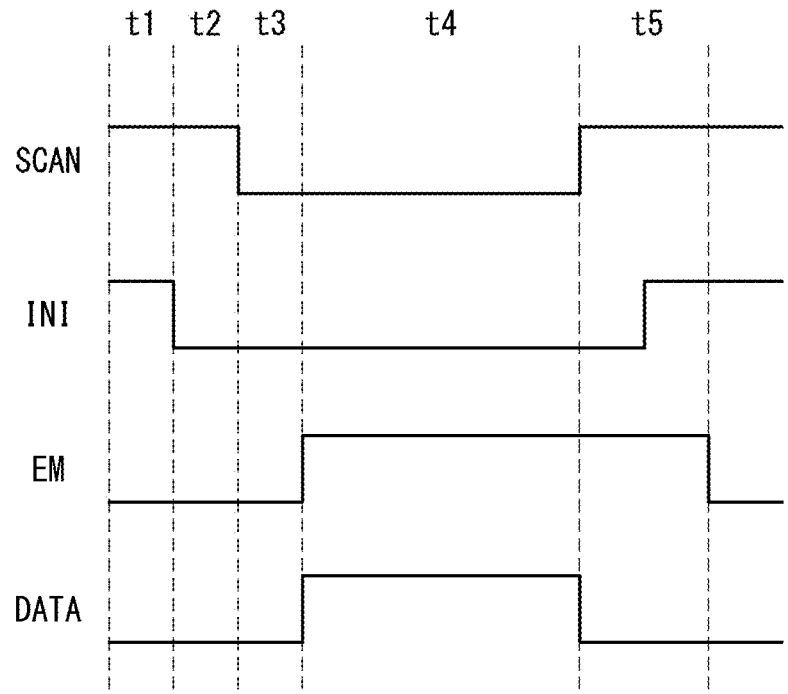

In the case where a pixel circuit is implemented as the same as illustrated in FIG. 4, a gate signal applied to the pixels P along the gate lines GL may be divided into a scan signal SCAN, an emission control signal (hereinafter, referred to as an "EM signal") EM, and an initialization signal INI, as illustrated in FIG. 4. In this case, the gate lines GL may be divided into a scan line 71 for supplying a scan signal SCAN to pixels P arranged in one line, an EM line 72 for supplying an EM signal EM to pixels arranged in one line, and an INI line 73 for supplying an initialization signal INI to pixels P arranged in one line. The SCAN line 71, the EM line 72, and the INI line 73 are arranged in each line of the display panel 100.

As illustrated in FIG. 4, the display panel 100 may further include a VDDEL line 74 for supplying a pixel driving voltage VDDEL to pixels P, a Vref line 75 for supplying a reference voltage Vref to pixels, and a VSSEL electrode 76 for supplying a low-potential power voltage VSSEL to pixels. The power lines are connected to a power circuit not shown in the drawings.

Using a DC-Dc converter, the power circuit generates DC power necessary to drive the display panel. The DC-DC converter includes a charge pump, a regulator, a buck converter, a boost converter, etc. The power circuit may be implemented as a Power Integrate Circuit (PIC). The power circuit may output power, for example, VDDEL, VSSEL, VGH, VGL, Vref, and an analog gamma voltage, which is necessary to drive the pixels P of the display panel.

A compensation circuit provided in the electroluminescent display device to compensate for difference between driving characteristics between pixels may be divided into an internal compensation circuit and an external compensation circuit. The internal compensation circuit is provided in each pixel, and automatically compensates for a deviation in threshold voltages between the driving elements by sampling threshold voltages of a driving elements, and drives pixels by adding the respective threshold voltages to a data voltage of pixel data, so that. The external compensation circuit compensates for a variation in electrical characteristics of each pixel by sensing electrical characteristics of driving elements and modulates pixel data of an input image based on a sensing result. The display panel 100 may include an internal compensation circuit or an external compensation circuit for compensating for a threshold voltage and mobility of a driving element formed in each sub-pixel in real time.

The pixel array operates as a screen for displaying data of an input image in a display mode. Some or all of the pixels of the pixel array may act as an image sensor for sensing a fingerprint, an image, a touch input, etc. in a sensor mode.

A touch input may be sensed using additional touch sensors or may be sensed through pixels. The touch sensors may be implemented as on-cell type or add-on type touch sensors arranged on the screen of the display panel, or may be implemented as in-cell type touch sensors embedded in the pixel array. The touch pixels P may sense a touch input in the sensor mode, and thus, the touch sensors are not essential.

The display panel driving circuit 12 and 13 includes a data driver 12 and a gate driver 13. The display panel driving circuit 12 and 13 writes data of an input image into pixels of the display panel 100 in the display mode under the control of a timing controller 11. Meanwhile, the display panel driving circuit 12 and 13 drives the pixels as photo sensors in the sensor mode.

The data driver 12 operates in the display mode to supply a data voltage of an input image to the data lines DL. The data driver 12 generates a data voltage by converting pixel data of a input image received from the timing controller 11 into an analog gamma voltage using a Digital-to-Analog Converter (hereinafter, referred to as a "DAC"), and outputs the data voltage to the data lines DL. The data driver 12 does not output the data voltage in the sensor mode.

The gate driver 13 operates in the display mode and supplies a gate signal, which is to be synchronized with a data voltage, to the gate lines so as to select pixels arranged in one line, the pixels into which data of an input image is to be written. The gate signal swings between a gate on voltage for turning on a Thin Film Transistor (TFT), and a gate off voltage for turning off the TFT. In an NMOS TFT, the gate on voltage is a gate high voltage VGH, and the gate off voltage is a gate low voltage VGL. In a PMOS TFT, the gate on voltage is VGL, and the gate off voltage is VGH.

Figure 10A:
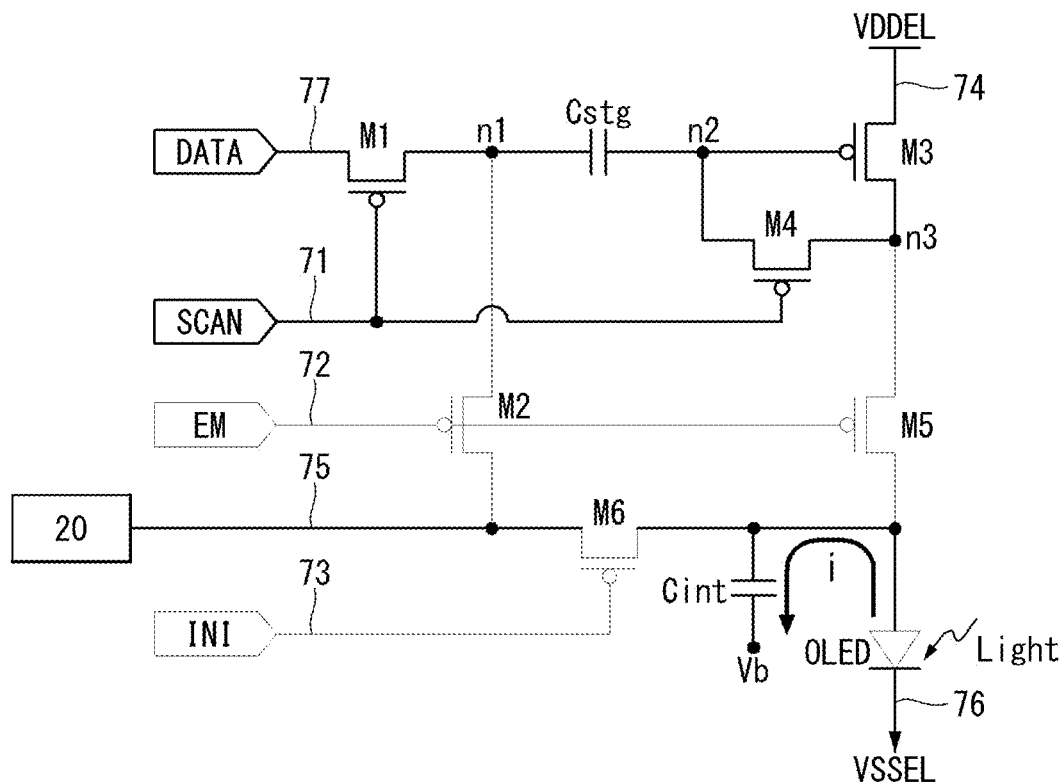
Figure 10A:
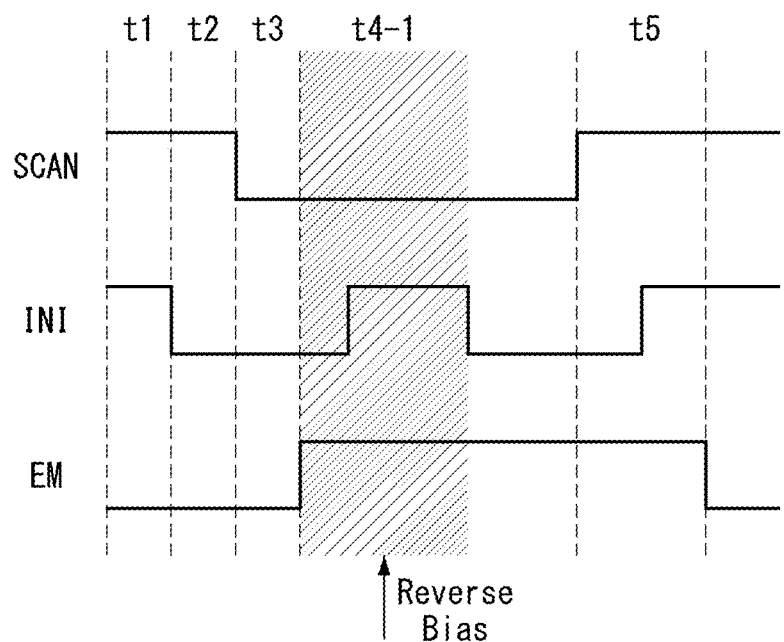

The gate driver 13 includes a shift resister. The shift register includes a plurality of stages connected dependently to shift an output voltage at a gate shift clock timing to thereby sequentially select pixels per line, the pixels into which data is to be written. Under the control of the timing controller 11, the gate driver 13 supplies a modulated gate signal to pixels in the sensor mode, as illustrated in FIG. 10A.

A shift register of the gate driver 13 as well as a TFT array of the pixel array may be mounted on a substrate of the display panel 100. Transistors included in the pixel array and the shift register of the gate driver 13 may be implemented as at least one of TFTs including an oxide semiconductor TFT, an a-Si TFT, and a Low Temperature Poly Silicon (LTPS). The TFT may be implemented in a structure of Metal Oxide Semiconductor Field Effect Transistor (MOSFET). A TFT may be implemented as a n-type transistor (NMOS), a p-type transistor (PMOS), or a combination thereof.

In the display mode, the timing controller 11 transmits pixel data of an input image received from a host system 300 to the data driver 12. In the display mode, the timing controller 11 receives pixel data DATA of an input image and input timing signals from a host system 300. The input timing signals includes a vertical synchronization signal Vsync, a horizontal synchronization signal Hsync, a data enable signal DE, and a dot clock DCLK, etc. Based on the timing signals Vsync, Hsync, DE, and DCLK received along with the pixel data of the input image, the timing controller 11 generates a timing control signal DDC or GDC for controlling an operation timing of the data driver 12, the gate driver 13, and the sensor signal processing circuit 20. The display panel driving circuit 12 and 13 and the sensor signal processing circuit 20 are synchronized by the timing controller 11. The timing controller 11 may determine an operation mode based on a mode signal MODE received from the host system 300.

By increasing a frame rate of an input image to a frequency of frame rate×N (N is an integer equal to or greater than 2) Hz, the timing controller 11 may control an operation frequency of the display panel driving circuit 12 and 13 and the sensor signal processing circuit 20 to be the frame rate multiplied by N. A frame rate of an input image is 60 Hz according to the National Television Standards Committee (NTSC) standard, and it is 5-Hx according to the Phase-Alternating Line (PAL) standard.

The host system 300 may be any one of a television system, a set-top box, a navigation system, a personal computer (PC), a home theater, a mobile system, a wearable system, and a virtual reality system. In the display mode, the host system 300 transmits data of an input image and a timing signal to the timing controller 11.

The host system 300 executes an application associated with a signal received from the sensor signal processing circuit 20. For example, once a fingerprint pattern is received from the sensor signal processing circuit 20, the host system 300 executes a user authentication process by comparing the received fingerprint pattern with stored user fingerprint pattern data. In addition, once scan image data is received from the sensor signal processing circuit 200, the host system 300 transmits the image data to the timing controller 11 and represents the image data on the pixel array. The host system 300 shifts an operation mode depending on a user command received from the user interface 310 or a preset program, generates a mode signal MODE indicative of the operation mode, and transmits the mode signal MODE to the timing controller 11 and the sensor signal processing circuit 20. The user interface 310 may be implemented as a keypad, a keyboard, a mouse, an On Screen display (OSD), a remote controller, a Graphic User Interface (GUI), a touch User Interface (UI), a voice recognition UI, a 3D UI, etc.

Figure 9:
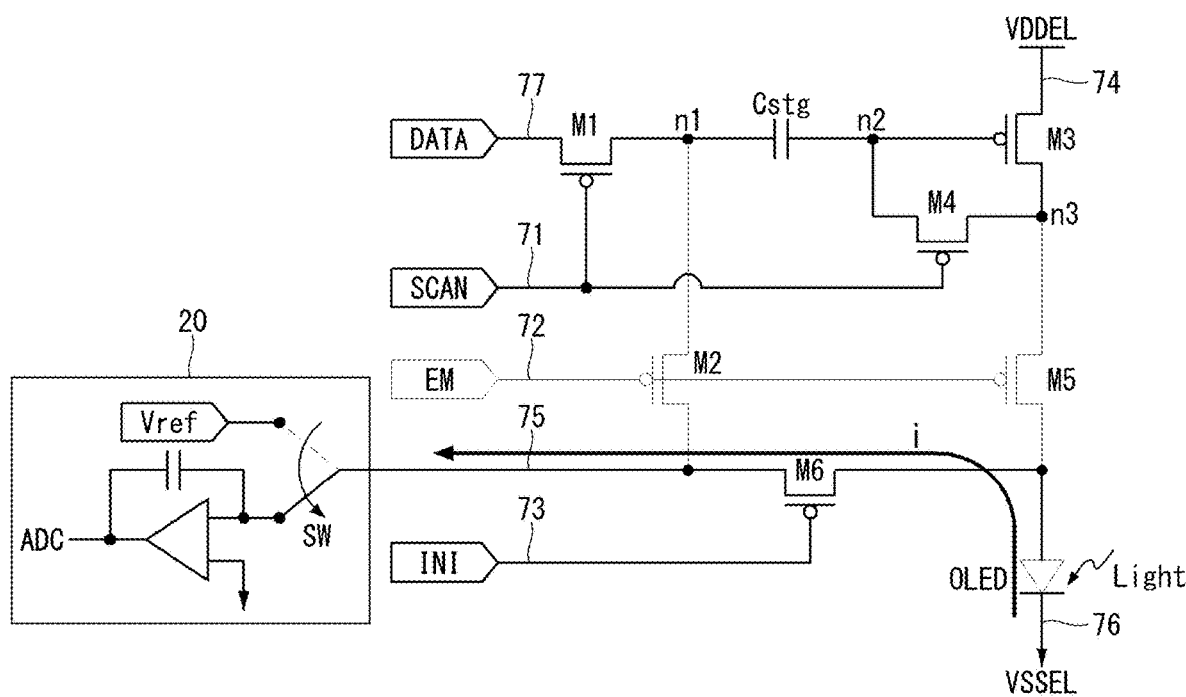
FIGS. 9 to 10B are circuit and waveform diagrams illustrating each step of operation of the pixel circuit shown in FIG. 4 in a sensor mode.
Figure 9:
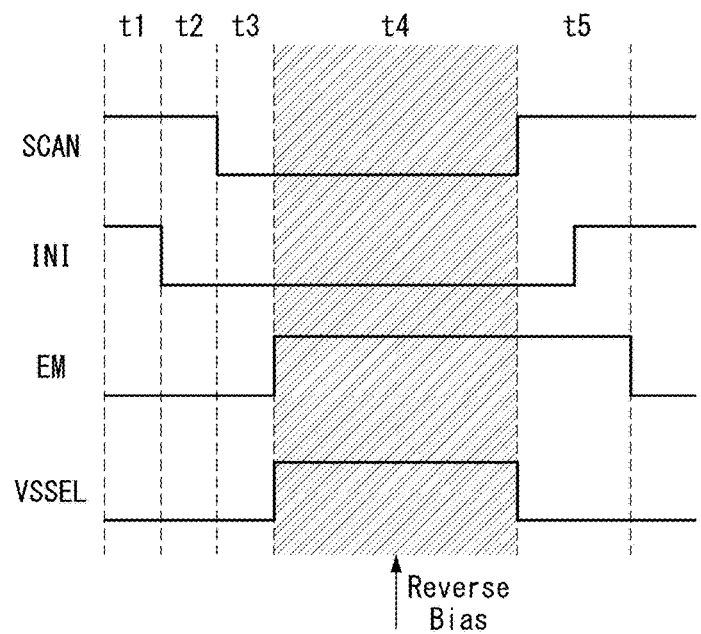
Figure 10B:
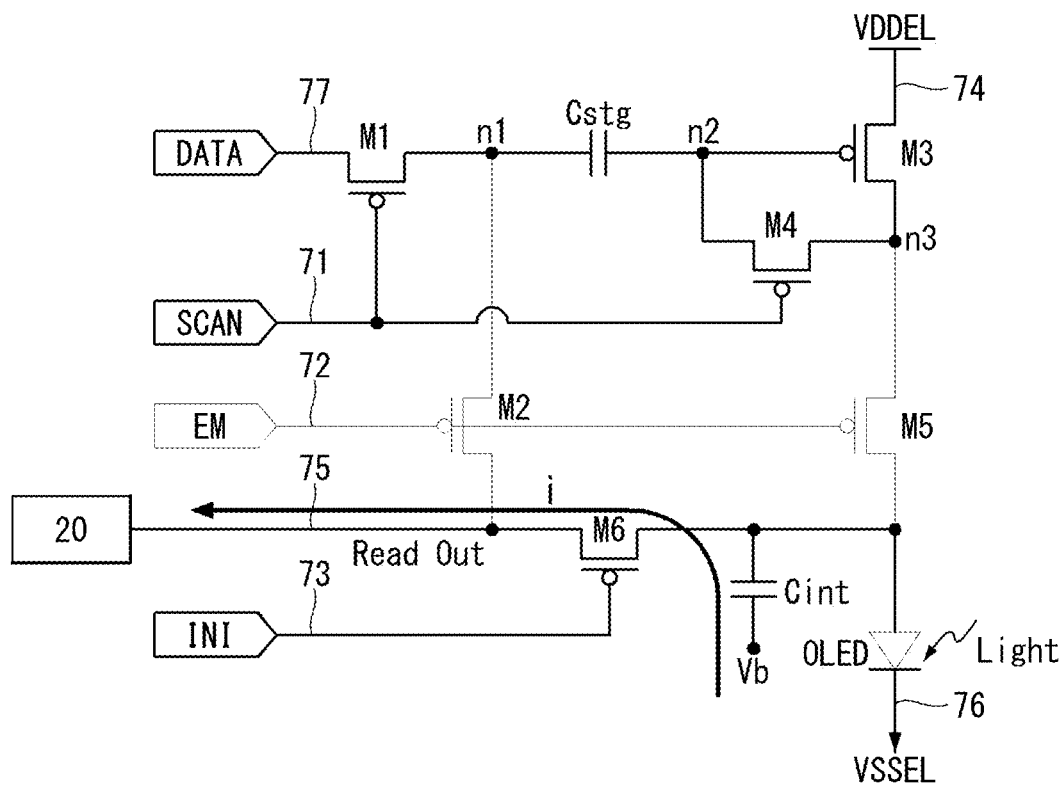
Figure 10B:
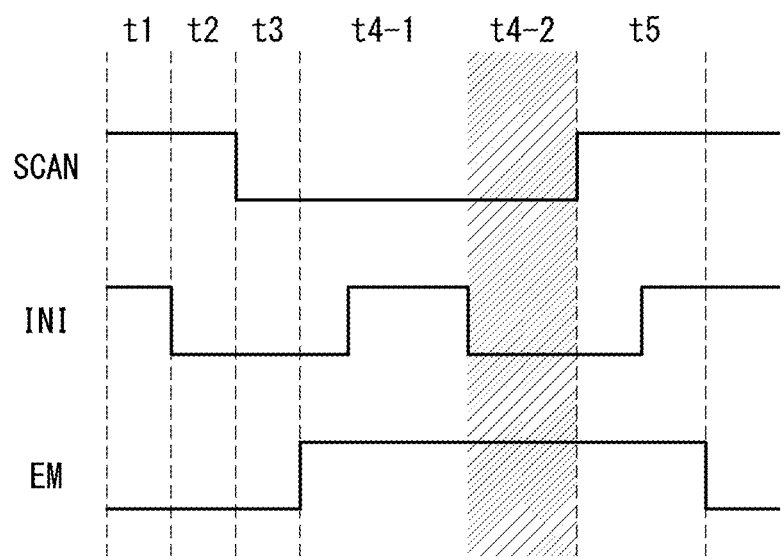

In the sensor mode, the sensor signal processing circuit 20 applies a reverse bias to pixels, amplifies a sensor signal received from the pixels, and converts an amplified analog signal into digital data FS using an Analog-to-Digital Converter (ADC). In the sensor mode, the sensor signal processing circuit 20 may apply a reverse bias to an OLED by increasing a cathode voltage of the OLED. As illustrated in FIGS. 9 and 10B, the sensor signal processing circuit 20 may apply a reverse bias to OLEDs of pixels by increasing a voltage VSSEL. The digital data output from the ADC is recognized by a preset image processing algorithm as fingerprint pattern data, image data, and touch input data, and then transmitted to the host system 300. The sensor signal processing circuit 20 may be implemented as a Read-out Integrated Circuit (ROIC). Hereinafter, a "sensor signal processing circuit" is referred to as an "ROIC." The ROIC 20 determines an operation mode depending on a mode signal MODE. As illustrated in FIG. 9, the ROIC 20 may apply a reference voltage Vref to pixels P in the display mode, while blocking the reference voltage Vref in the sensor mode.

FIG. 4 is a circuit diagram illustrating a pixel circuit and a waveform of a driving signal from the pixel circuit. The pixel circuit of the present disclosure is not limited to what is shown in FIG. 4.

Referring to FIG. 4, a pixel circuit includes a plurality of TFTs M1 to M6, a capacitor Cstg, and an OLED.

In one horizontal period 1H, a scan signal SCAN, an initialization signal INI, and an EM signal EM are supplied to the pixels P. In one horizontal period 1H, operation of the pixel circuit may be divided into an initialization period t2 and t3, and a programming period t4. In the initialization period t2 and t3, all nodes n1, n2, and n3 of the pixel circuit are initialized. In the programming period t4, a threshold voltage Vth of a driving element of the OLED, that is, a third TFT M3, is sampled and added to a data voltage Vdata, so that the threshold voltage Vth of the driving element M3 is compensated as much as the threshold voltage Vth of the driving element M3.

The OLED includes an anode and a cathode. The anode of the OLED is connected to a fifth TFT M5 and a sixth TFT M6. A low-potential power voltage VSSEL is applied to the cathode of the OLED.

The first TFT M1 is turned on in response to the scan signal SCAN and applies a data signal received along a data line 77 to a first node n1. The first TFT M1 includes a gate connected to a gate line 71, a first electrode connected to the data line 77, and a second electrode connected to the first node n1.

The second TFT M2 is turned on in response to an EM signal EM and initializes the first node n1 to a specific reference voltage Vref. The second TFT M2 includes a gate connected to the EM line 72, a first electrode connected to the first node n1, and a second electrode connected to the Vref line 75 to be supplied with the reference voltage Vref. The fifth TFT M5 is turned on in response to the EM signal to initialize a third node n3 to the reference voltage Vref. The fifth TFT M5 includes a gate connected to the EM line 72, a first electrode connected to the third node n3, and a second electrode connected to the anode of the OLED.

The third TFT M3 is a driving element that operates the OLED by adjusting a current flowing in the OLED in response to a gate voltage. The third TFT includes a gate connected to a second node n2, a first electrode connected to the VDDEL line 74 to be supplied with VDDEL, and a second electrode connected to the third node n3. The capacitor Cstg is connected between the first and second nodes n1 and n2 to maintain a data voltage, to which a threshold voltage of the third TFT M3 is added, during one frame period.

The fourth TFT M4 is turned on during a period t3 and t4, in which the threshold voltage of the third TFT M3 is being sampled, and connects the gate and second electrode of the third TFT M3. Due to the fourth TFT M4, the third TFT M3 operates as a diode in periods t3 and t4. The fourth TFT M4 includes a gate connected to the SCAN line 71 to be supplied with a scan signal SCAN, a first electrode connected to the gate of the third TFT M3, and a second electrode connected to the second electrode of the third TFT M3.

The sixth TFT M6 is turned on in response to an initialization signal INI and initializes the anode of the OLED to the reference voltage Vref. The sixth TFT M6 includes a gate connected to the INI line 73, a first electrode connected to the Vref line 75, and a second electrode connected to the anode of the OLED.

In the following, each step of operation of a pixel circuit in the display mode will be described.

Figure 5:
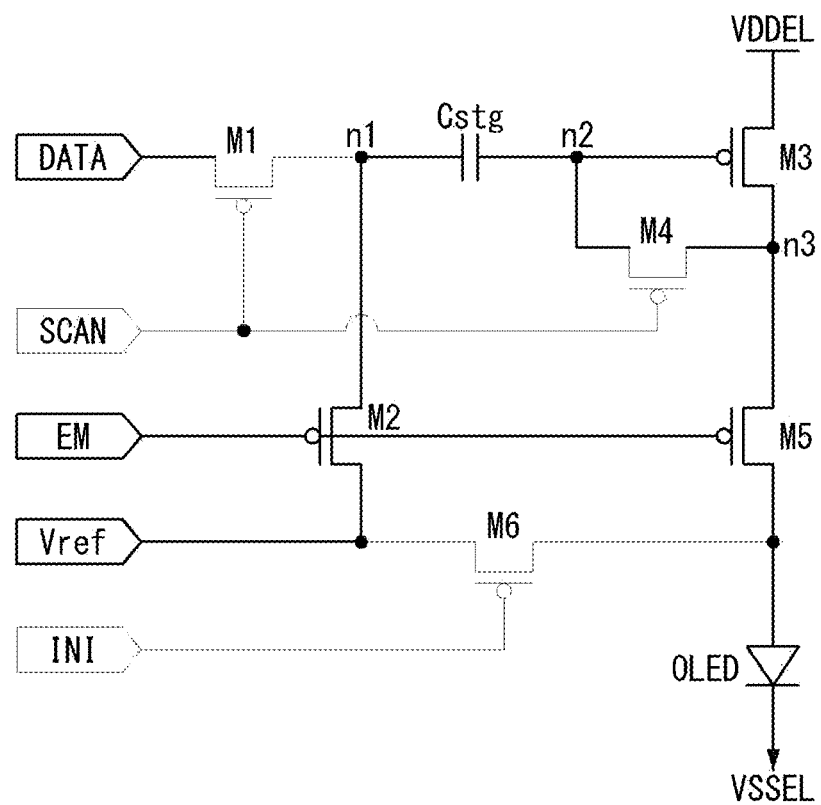
FIGS. 5 to 8 are circuit and waveform diagrams illustrating each step of operation of the pixel circuit shown in FIG. 4 in a display mode.
Figure 5:
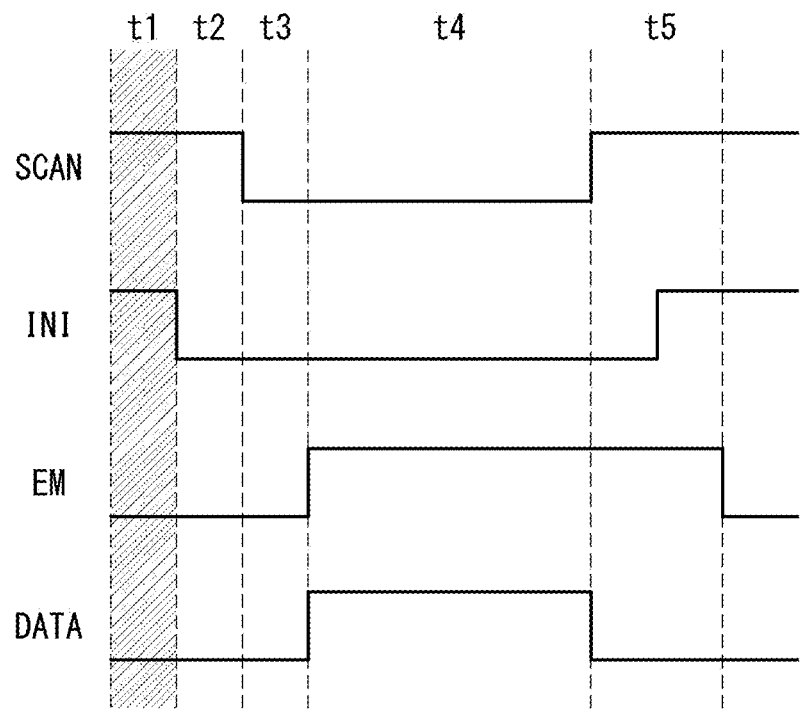
Figure 6:
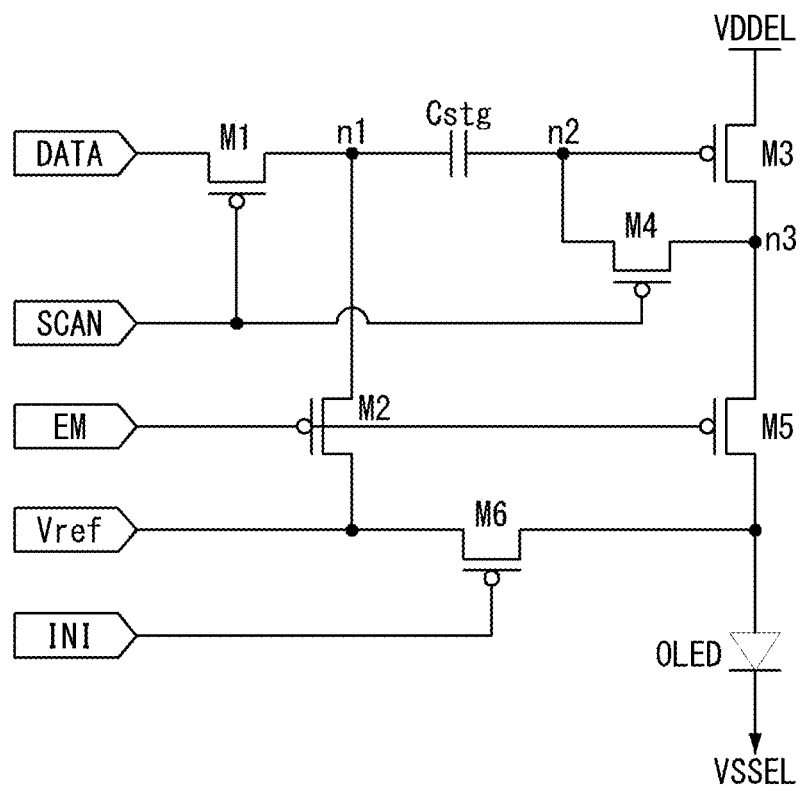
Figure 6:
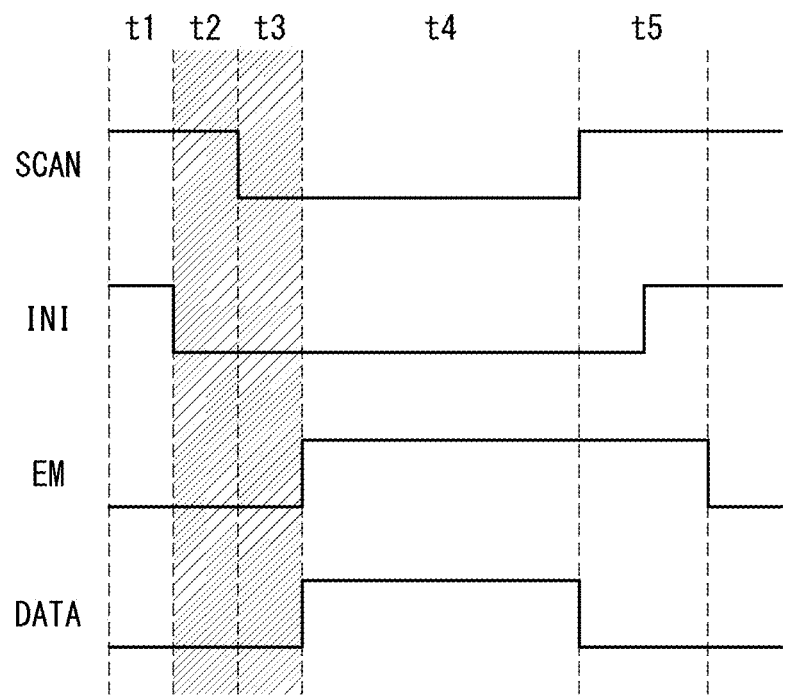
Figure 7:
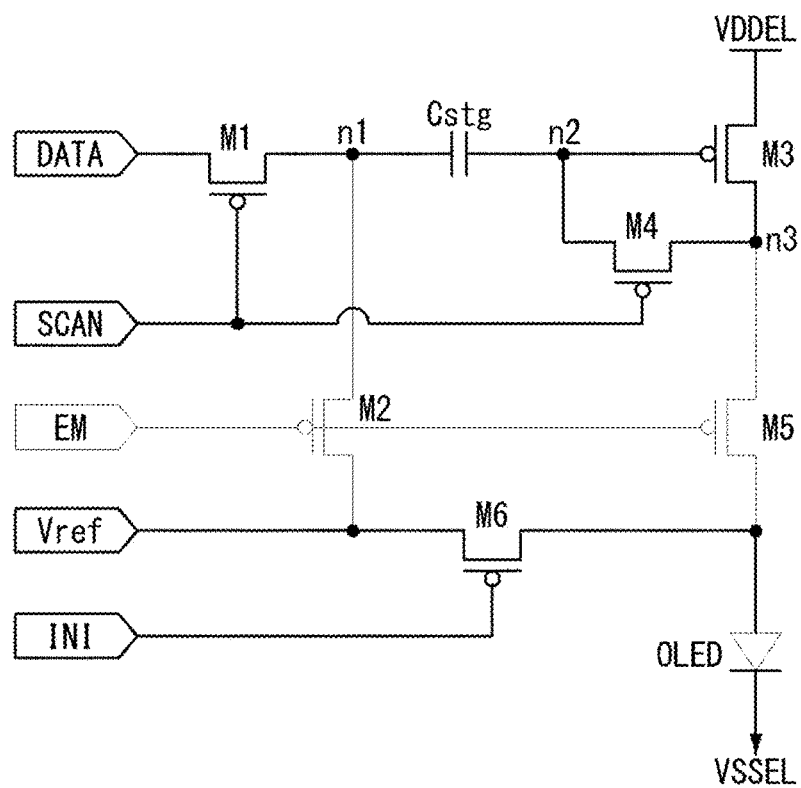
Figure 7:
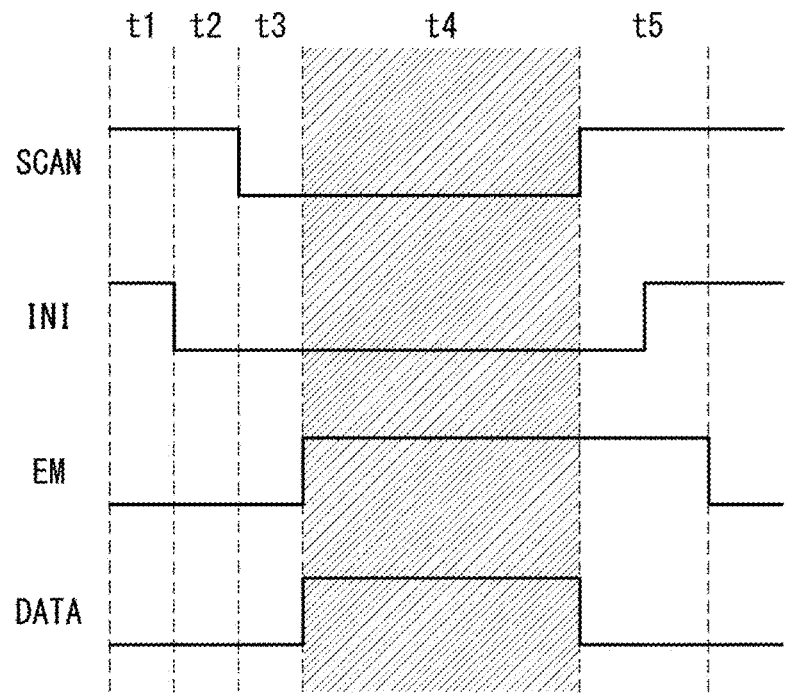
Figure 8:
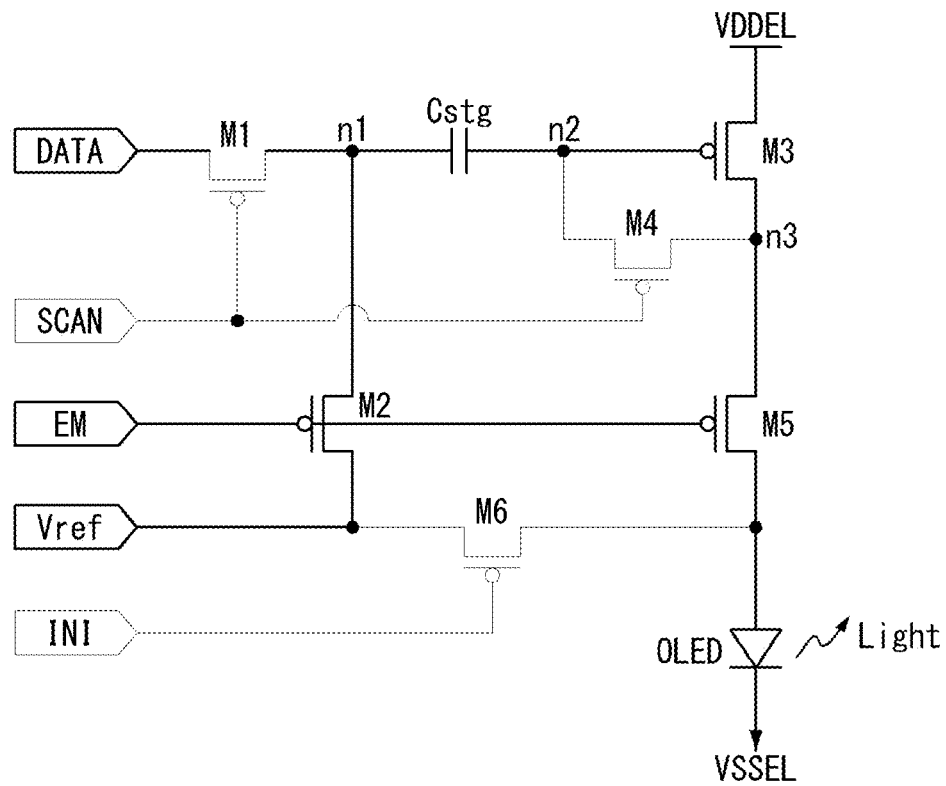
Figure 8:
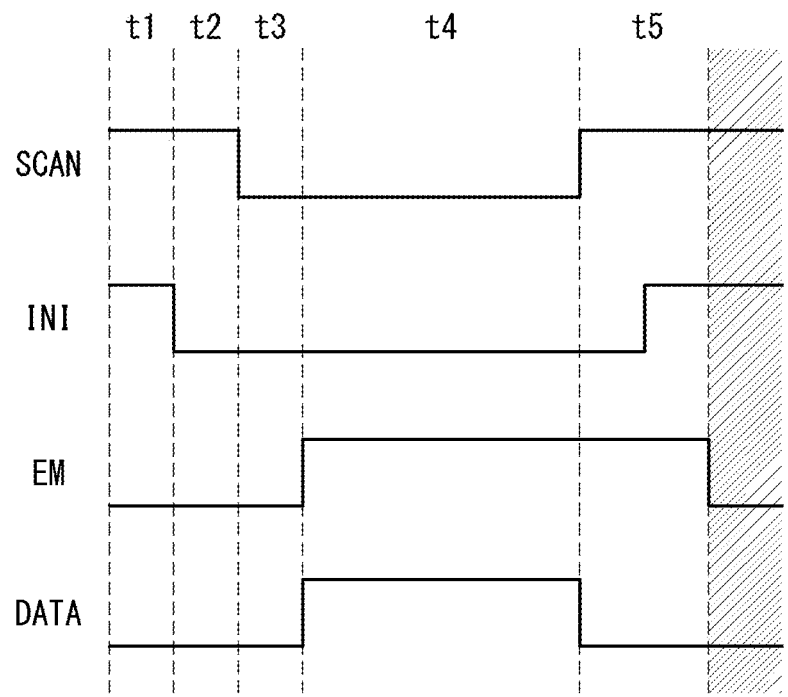

FIG. 5 is a diagram illustrating operation of a pixel circuit, shown in FIG. 4, in a period t1 of the display mode. FIG. 6 is a diagram illustrating operation of a pixel circuit, shown in FIG. 4, in periods t2 and t3 of the display mode. FIG. 7 is a diagram illustrating operation of a pixel circuit, shown in FIG. 4, in a period t4 of the display mode. FIG. 8 is a diagram illustrating operation of a pixel circuit, shown in FIG. 4, in a period t5 of the display mode.

As illustrated in FIG. 5, each pixel maintains previous frame data before a period t1. In the period t1, a reference voltage Vref is applied as a voltage of the first node n1.

Referring to FIG. 6, a gate on voltage of the initialization signal is applied to the pixel circuit at the beginning of the period t2, and a gate on voltage of the scan signal SCAN is applied to the pixel circuit in the period t3. In the periods t2 and t3, the sixth TFT M6 is turned on in response to a gate on voltage of the initialization signal INI and the first and fourth TFTs M1 and M4 are turned on in response to a gate on voltage of the scan signal SCAN. Because the EM signal EM remains at a gate on voltage in the periods t2 and t3, the second and fifth TFTs M2 and M5 are maintained in the On state. As a result, in the period t2, the first node n1, the second node n2, the third node n3, and the anode of the OLED are initialized to the reference voltage Vref.

Referring to FIG. 7, the EM signal EM is reversed to a gate off voltage in the period t4. Thus, the second and fifth TFTs M2 and M5 are turned off in the period t4. In the period t4, a data voltage DATA is charged in the first node n1 through the first TFT M1. In the period t4, the third TFT M3 is turned off until a voltage between the gate and the second electrode of the third TFT M3 reaches to VDDEL+Vth. As a result, voltages of the second and third nodes n2 and n3 are charged to VDDEL+Vth in the period t4. At this point, a voltage of the capacitor Cstg is VDDEL+Vth+Vdata. Vth denotes a threshold voltage of the third TFT M3 which is a driving element.

Referring to FIG. 8, the EM signal EM is reversed to a gate on voltage at the beginning of the period t5. The period t5 is a period of time in which the OLED emits light in response to a data voltage to thereby emit light as much as a gray level of pixel data. In the period t5, the scan signal SCAN and the initialization signal INI are reversed to a gate off voltage. Thus, the second and fifth TFT M2 and M5 are turned on in the period t5 to form a current path of the OLED, whereas other switch elements M1, M4, and M6 are turned off in the period t5.

The current Ioled flowing in the OLED in the period t5 is represented as in the following Equation. As found in the Equation, the current flowing in the OLED is not affected by Vth of the third TFT M3, and thus, it is not affected by a sequential change of Vth or a deviation in Vth between pixels. In the following Equation, Vgs denotes a gate-source voltage of the third TFT M3, and Vds denotes a drain-source voltage of the third TFT M3.

$$I_{OLED} = \frac{K}{2}(Vgs - Vds)^2$$
$$= \frac{K}{2}[(VDDEL + Vth - Vdata + Vref - VDDEL) - (VDDEL + Vth - VDDEL)]^2$$
$$= \frac{K}{2}[(Vth - Vdata + Vref) - Vth]^2$$
$$= \frac{K}{2}(Vref - Vdata)^2$$

Here, K is a proportionality constant determined upon an electron mobility of the third TFT M3, a parasitic capacitance, and channel capacitance.

FIG. 9 to FIG. 10B are diagrams illustrating sequential steps of operation of a pixel circuit, shown in FIG. 4 in the sensor mode. FIG. 9 illustrates a method of controlling pixels in the sensor mode according to the first embodiment of the present disclosure.

Referring to FIG. 9, in the period t4 of the sensor mode, the ROIC 20 connects the Vref line 75 to a sensing channel using a switch element SW. The period t4 of the display mode may be referred to as a "display mode programming period," while the corresponding period t4 of the sensor mode may be referred to as a "sensor mode programming period," as the period t4 in the sensor mode corresponds with the programming period t4 of the display mode, with the differences as will be discussed with respect to FIG. 9. In the sensor mode, the Vref line 75 of pixels is connected to an amplifier of the sensing channel in the ROIC 20. In the sensor mode, the amplifier receives a sensor signal from the pixels, amplifies a voltage of the sensor signal, and outputs the voltage to the ADC. As the sixth TFT M6 is turned on in the period t4, the sensing channel of the ROIC 20 is connected to an OLED. In the period t4, a low-potential power voltage VSSEL has a voltage level higher than an anode voltage of the OLED, thereby applying a reverse bias to the OLED. Therefore, if light is emitted to OLEDs of the respective pixels in the period t4, a photoelectric current i flows to thereby generate a sensor signal.

The switch element SW of the ROIC 20 supplies Vref to the Vref line 75 in the display mode, while connecting the Vref line 75 to the sensing channel of ROIC 20 in the sensor mode. Thus, the electroluminescent display device integrated with image sensors utilizes pixels, which displays an input image in the display mode, as image sensors in the sensor mode, thereby enabled to implement image sensors within a display panel without any loss of the aperture ratio of a pixel array.

FIGS. 10A and 10B illustrate a method of controlling pixels in the sensor mode according to a second embodiment of the present disclosure.

Referring to FIGS. 10A and 10B, a capacitor Cint may be connected to an anode of an OLED of each pixel P.

As opposed in the display mode, in the sensor mode, the timing controller 11 uses a gate timing control signal GDC to control a waveform of a gate signal from the gate driver 13 to be the same as a waveform shown in FIGS. 10A and 10B. Under the control of the timing controller 11, the gate driver 13 temporarily generates an initialization signal INI at a gate off voltage in the period t4 to thereby charge the capacitor Cint with a photoelectric current.

The period t4 of the sensor mode is divided into a photoelectric current charge period t4-1 and a signal transmission period t4-2. The period t4-1 is a period in which a sensor signal is charged in the capacitor Cint. The period t4-2 is a period in which a charged sensor signal is transmitted to the ROIC 20.

The initialization signal INI is reversed to a gate off voltage in the period t4-1. The sixth TFT M6 is turned off in response to the gate-off voltage in the period T4-1, and the capacitor Cint charges electric charges of the photoelectric current i. The initialization signal INI is reversed to a gate on voltage in the period t4-2. In response to the gate on voltage, the sixth TFT M6 is turned on in the period t4-2 to thereby connect the capacitor Cint to the Vref line 75. At this point, the sensing channel of the ROIC 20 connected to the Vref line 75 through the switch element SW receives a voltage of the capacitor Cint, that is, a sensor signal.

The sensor mode may be divided into a fingerprint sensing mode, a document image sensing mode, a touch sensing mode, etc. The sensor mode may be distinguished by a mode signal MODE.

Figure 11:
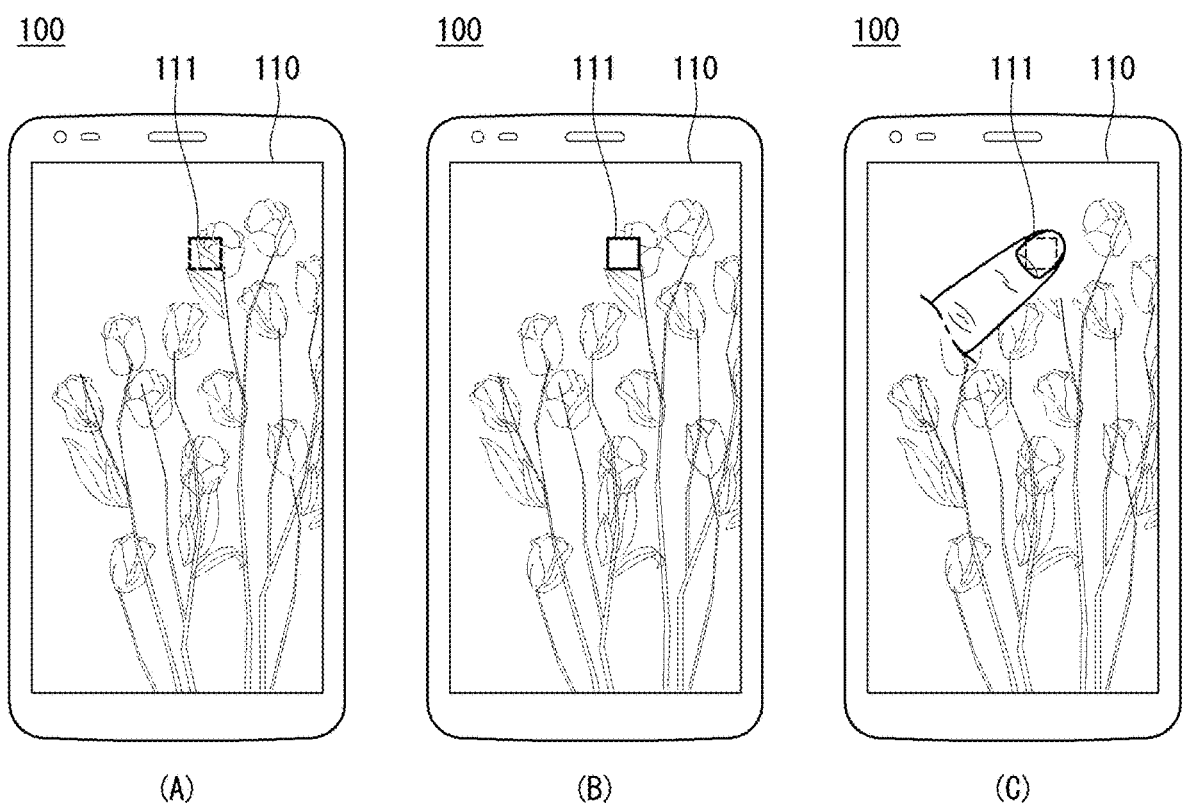
FIG. 11 is a diagram illustrating a fingerprint sensing area on a screen in a fingerprint sensing mode.

FIG. 11 is a diagram illustrating a fingerprint sensing area on a screen in the fingerprint sensing mode.

Referring to FIG. 11, in the fingerprint sensing mode, the presence or absence of a finger on the display panel 100 is determined. The presence or absence of a finger may be sensed using an additional touch sensor or a sensor signal received from pixels in the sensor mode. Once a finger touches the display panel 100, the host system 300 determines whether an icon or an execution/play file of an application or contents requiring fingerprint authentication is placed at a location of the finger. If finger authentication is required when the finger touch input is received, the host system 300 may select a fingerprint sensing area 111 at a corresponding location as in the example (A), and displays a preset screen in the fingerprint sensing area 111. The preset screen is a screen optimized for finger sensing. For example, the finger sensing area 111 may sense a fingerprint pattern in a manner in which some of the pixels P in the finger sensing area operate as a light sources to emit light and other pixels P operate as image sensors. The pixels P operating as light sources may emit white-based light as in the example (B), but aspects of the present disclosure are not limited thereto. The fingerprint sensing area 111 is covered by a finger, as in the example (C), and thus, it is not recognized by a user.

Figure 12:
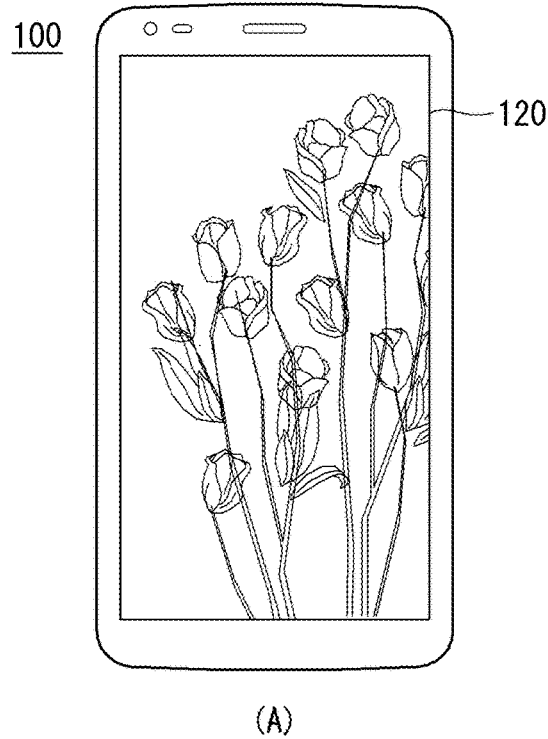
FIG. 12 is a diagram illustrating an example of document scanning in an image sensing mode.
Figure 12:
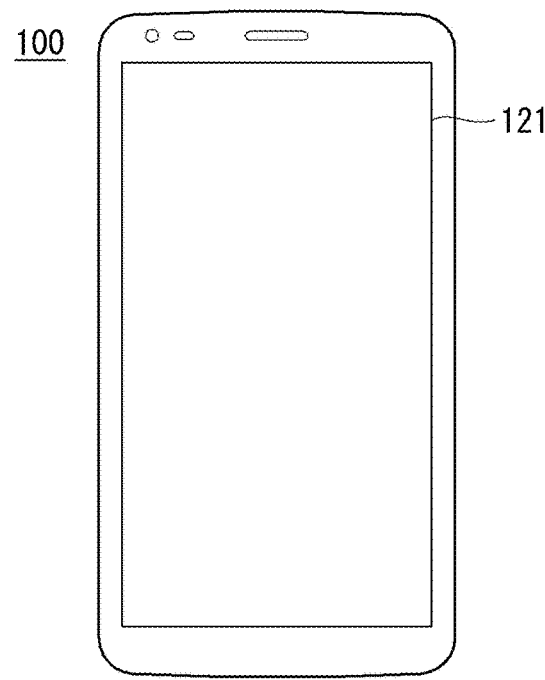
Figure 12:
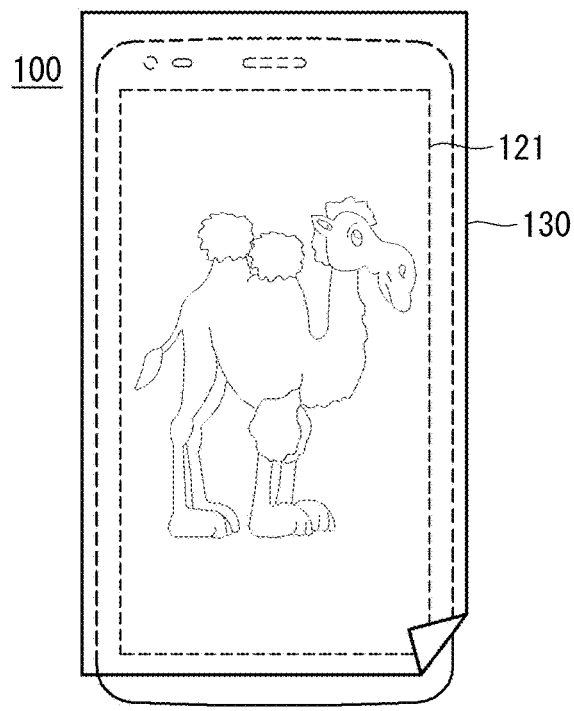
Figure 12:
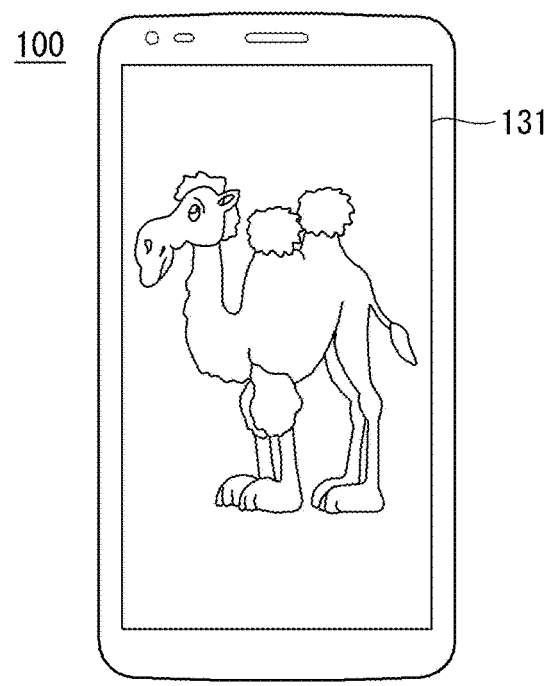

FIG. 12 is a diagram illustrating an example of document scanning in the image sensing mode.

Referring to FIG. 12, in the image sensing mode, a screen 121 of the display panel emits light with brightness which is optimized for image sensing, as shown in the example (B). At this point, some pixels P emits light as light sources, and other pixels P act as image sensors. (A) in FIG. 12 shows an example of a screen 120 before the image sensing mode. When a document to be scanned is put on the screen of the display panel, pixels P operate as image sensors to sense an image of the document. (D) in FIG. 12 shows an example of an image 131 which is scanned on the screen of the display panel.

In the case where OLEDs of the respective pixels are used as image sensors, if the pixels are driven in the sensor mode for a long time in order to obtain a sufficient quantity of photoelectric current, the pixels remains the operation state of the period t4, and this may make the screen dark, increase stress of the TFTs and reduce a time of the display mode. Therefore, it is necessary to operate the pixels on a screen optimized for the sensor mode. For example, the pixels P may operate in the sensor mode in the manners shown in FIGS. 13 and 14.

Figure 13:
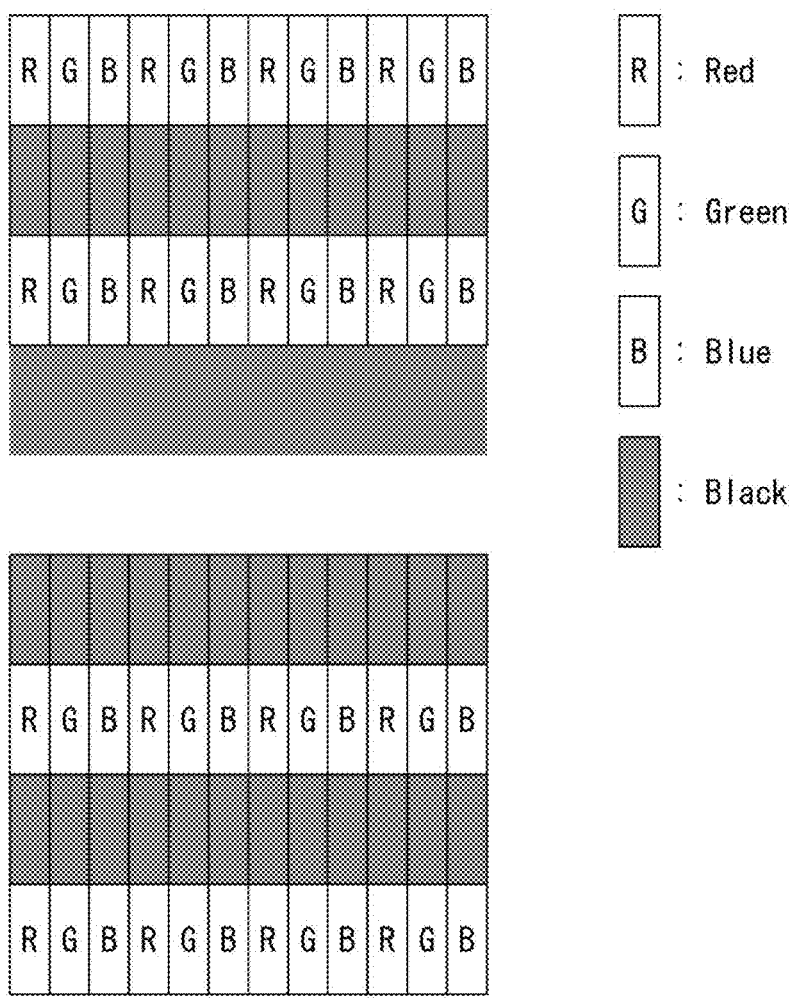
FIGS. 13 and 14 are diagrams illustrating examples of displaying a screen optimized for a sensor mode.
Figure 14:
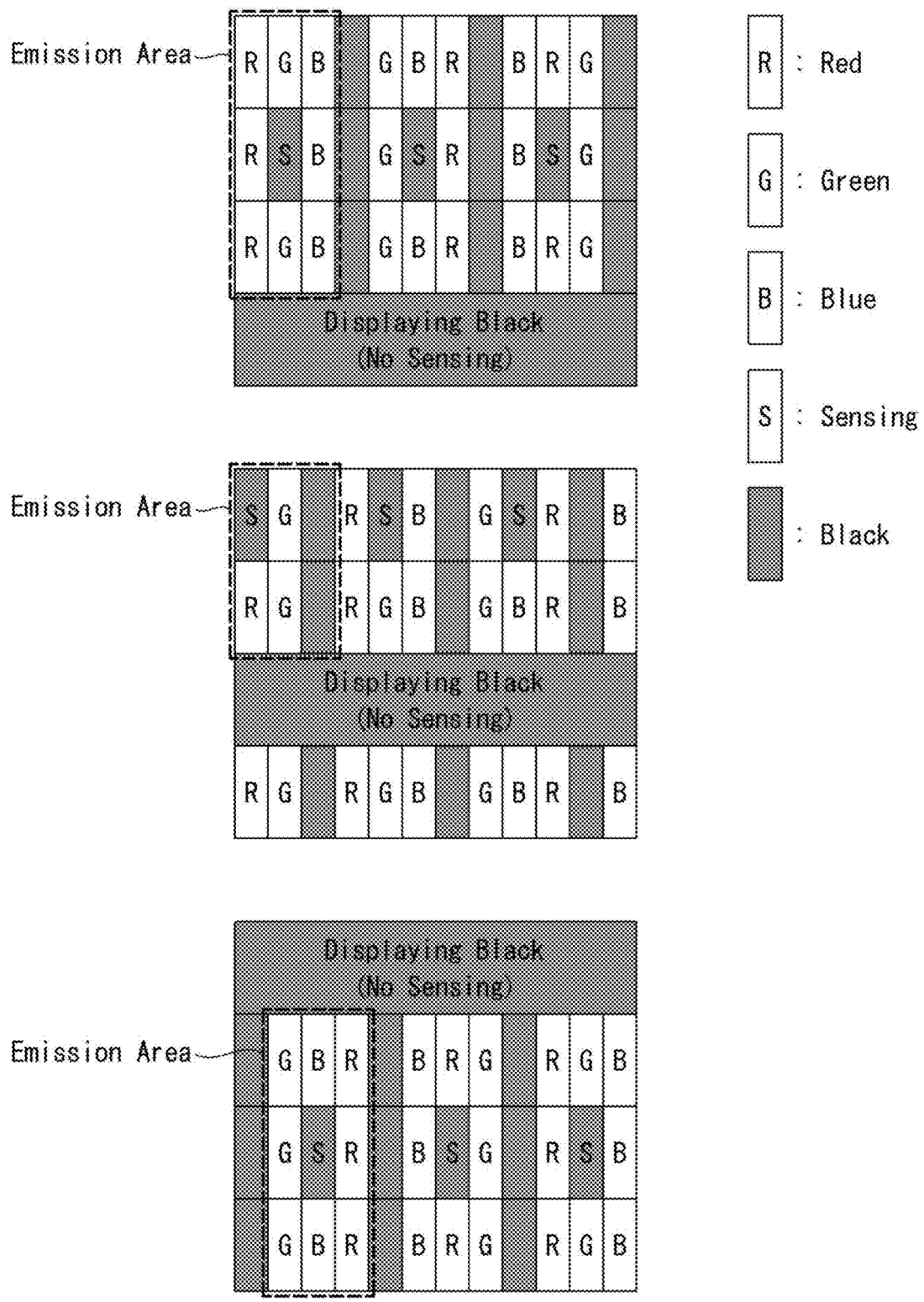

FIGS. 13 and 14 are diagrams illustrating examples of displaying a screen optimized for the sensor mode.

Referring to FIG. 13, in the sensor mode, pixels P arranged in at least part of the screen operates such that OLEDs emit light alternatively on a unit basis of pixel line, and a fingerprint pattern or a document image may be sensed by other pixels P to which a reverse bias is applied. Locations of the light emitting pixels and locations of other pixels, to which the reverse bias is applied, may shift on the basis of a predetermined time period, for example, one frame period, so as to precisely sense a fingerprint pattern or a document image within the area in which the screen is displayed. In the example of FIG. 13, a forward bias and a reverse bias are applied alternatively to odd-line pixels and even-line pixels, and therefore, a sensing subject is sensed at least twice.

The pixels emitting light in the sensor mode operate as light sources, and emit light of an intermediate gray level or light of a white gray level. The pixels operating as image sensors appears a black grays level because a reverse bias is applied to the corresponding pixels and does not emit light at all. In the sensor mode, a screen designated as a sensing area may entirely appear an intermediate gray level.

Referring to FIG. 14, at least part of the screen is divided into M×N pixel groups (M, N are respectively an integer equal to or greater than 3). A pixel S located in a central region of the M×N pixel groups operates as an image sensor to which a reverse bias is applied, whereas other pixels P in the surrounding of the pixel S operate as light sources to emit light. A reverse bias is applied to the pixel S, and a forward bias is applied to the pixels P in the surroundings of the pixel S. Pixels between the neighboring M×N pixel groups may display a black gray level and may not perform sensing. Locations of the M×N pixel groups shift on the basis of a predetermined time period, for example, one frame period, to sense a sensing subject. The position of the central region, in which a pixel S is located, may vary based on the size of the M×N pixel groups. For example, in a 3×3 pixel group, the pixel S may be located in a center of the pixel group, i.e., in the second row and second column of the 3×3 pixel group. In a 4×3 pixel group, on the other hand, pixel S may be located in a central region that includes pixels positioned in the second column and either of the second or third rows. A pixel located in the central region is thus a pixel that is surrounded by other pixels of the same M×N pixel group.

Figure 15:
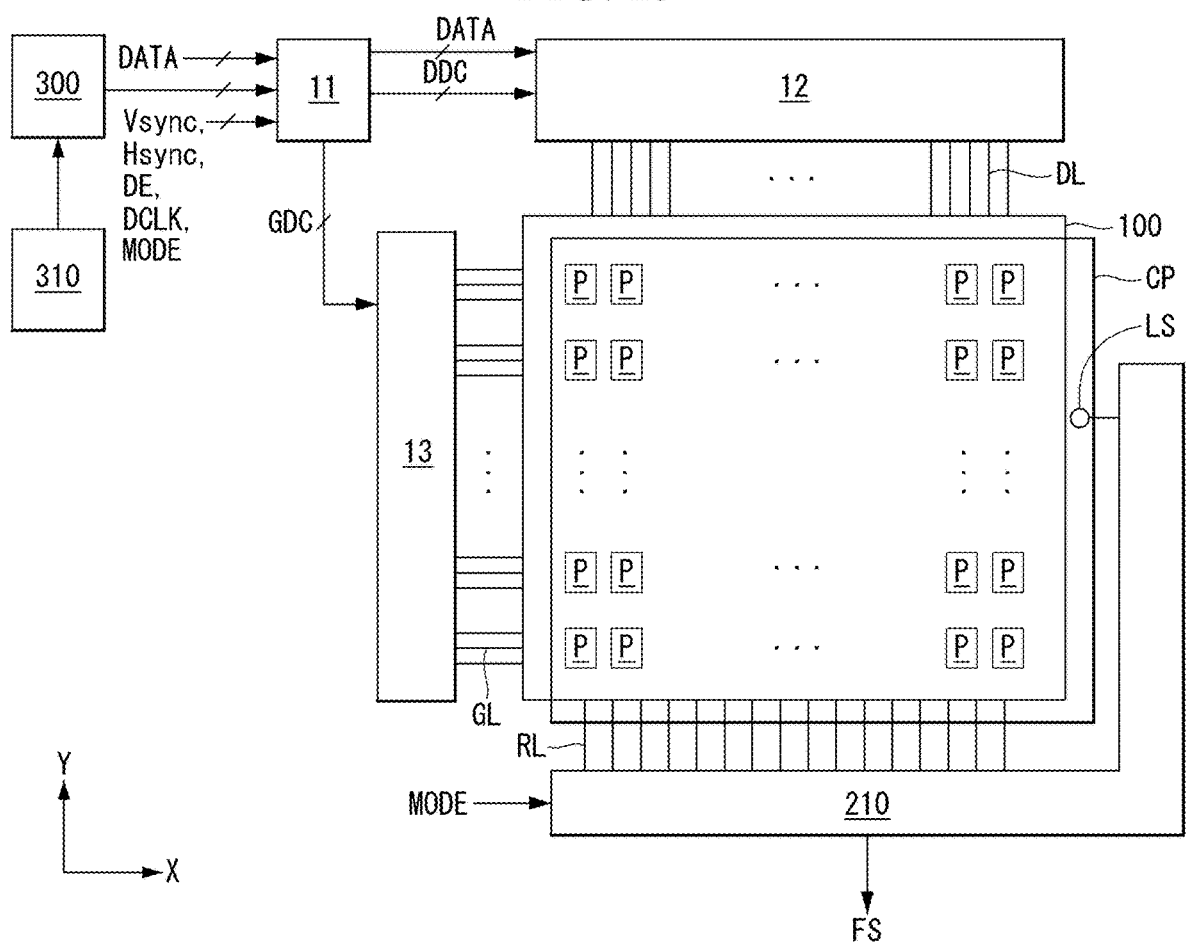
FIG. 15 is a block diagram illustrating an electroluminescent display device according to a second embodiment of the present disclosure.

FIG. 15 is a block diagram illustrating an electroluminescent display device according to the second embodiment of the present disclosure. In FIG. 15, like reference numerals refer to substantially identical elements in FIG. 3 and detailed description thereof will be omitted.

Referring to FIG. 15, the electroluminescent display device includes a display panel 100 on which a directional light source device SLS. The directional light source device SLS includes a transparent cover substrate arranged on the display panel 100, and a light source LS arranged on the edge of the transparent substrate CP. In addition, the directional light source device SLS includes optical elements for controlling optical paths in the transparent substrate CP. These optical elements are shown in FIGS. 16 to 19.

In the sensor mode, the ROIC 210 turns on the light source LS, amplifies sensor signals from the pixels P, to which a reverse bias is applied in the aforementioned manner, converts the sensor signals into digital data, and output sensor data. The ROIC 210 may apply a reference voltage Vref to the pixels P using the switch element SW in the display mode, and may block the reference voltage Vref in the sensor mode.

Figure 16:
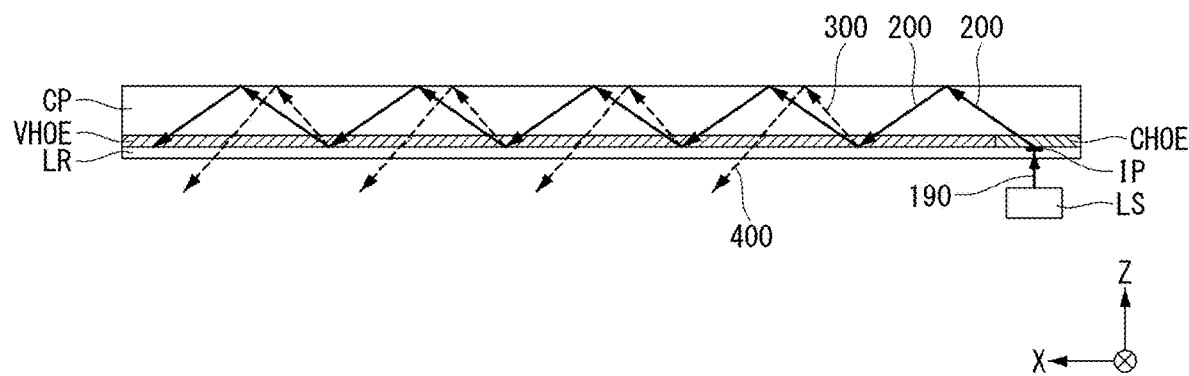
FIG. 16 is a cross-sectional view and a plane view illustrating a directional light source device.
Figure 16:
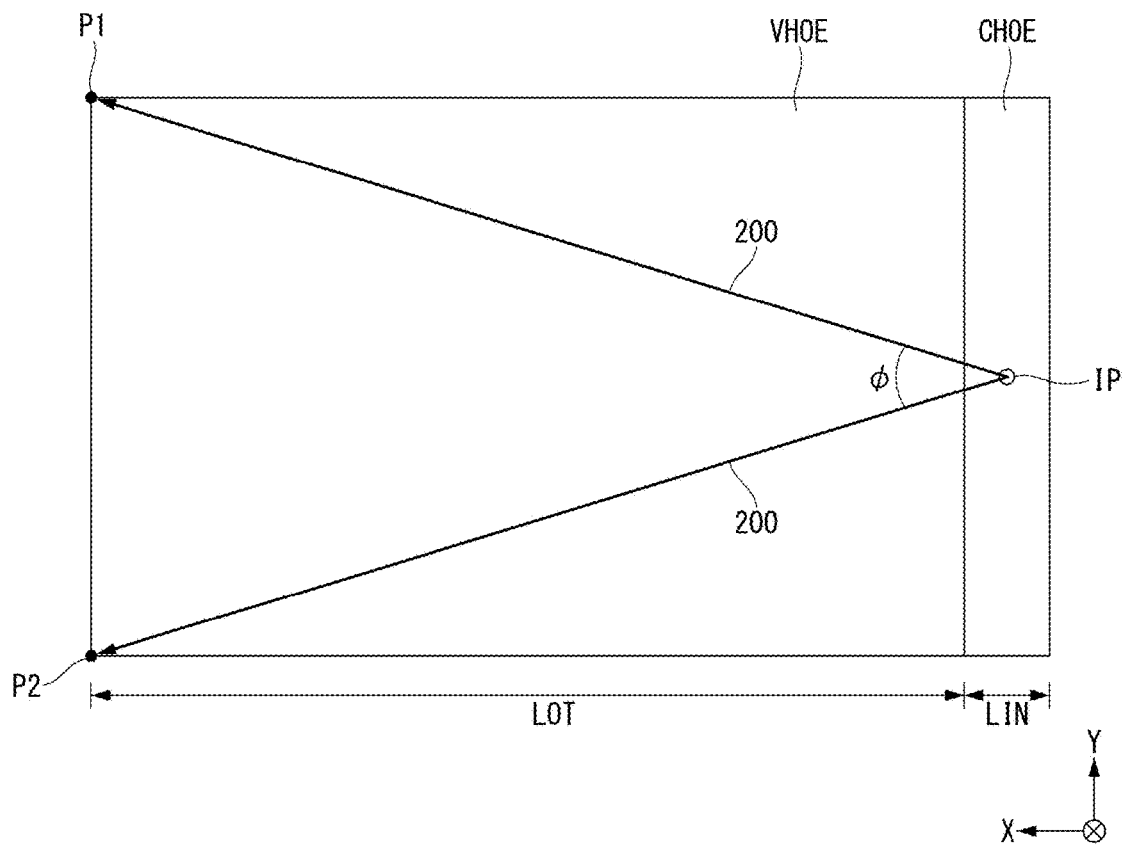
Figure 17:
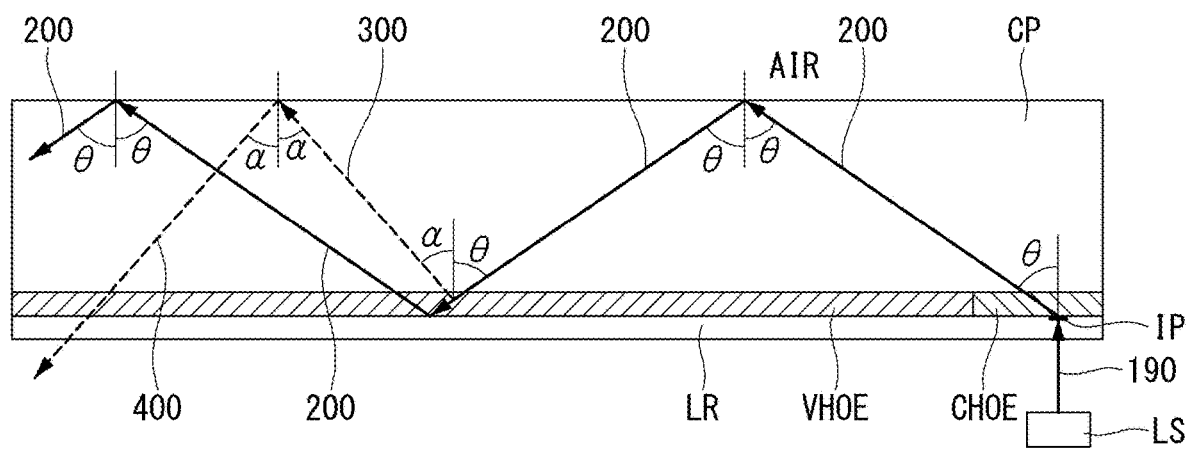
FIG. 17 is a cross-sectional view and a plane view illustrating optical paths in a transparent substrate shown in FIG. 16.
Figure 18:
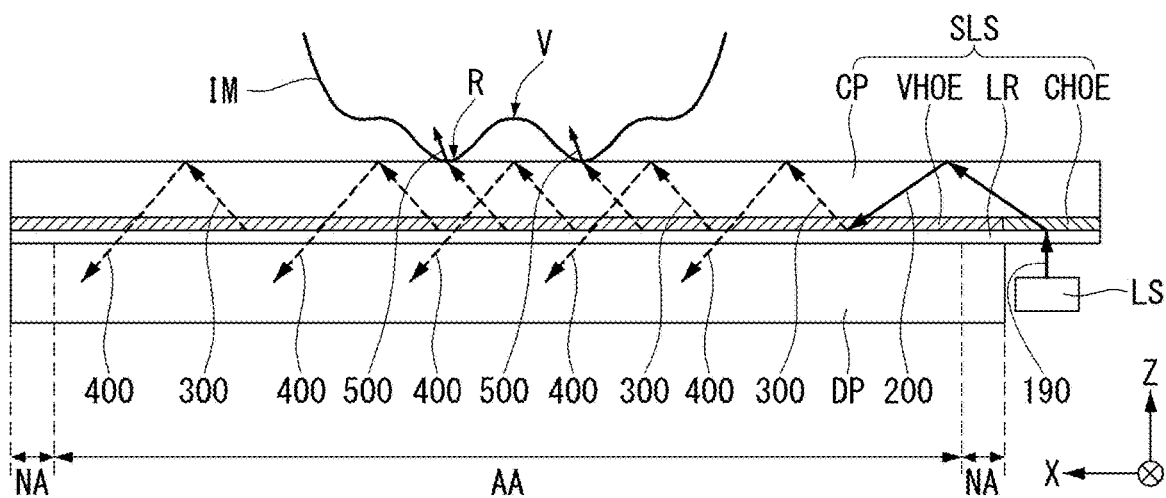
FIG. 18 is a cross-sectional view and a plane view illustrating a directional light source device (SLS) according to an embodiment of the present disclosure.
Figure 18:
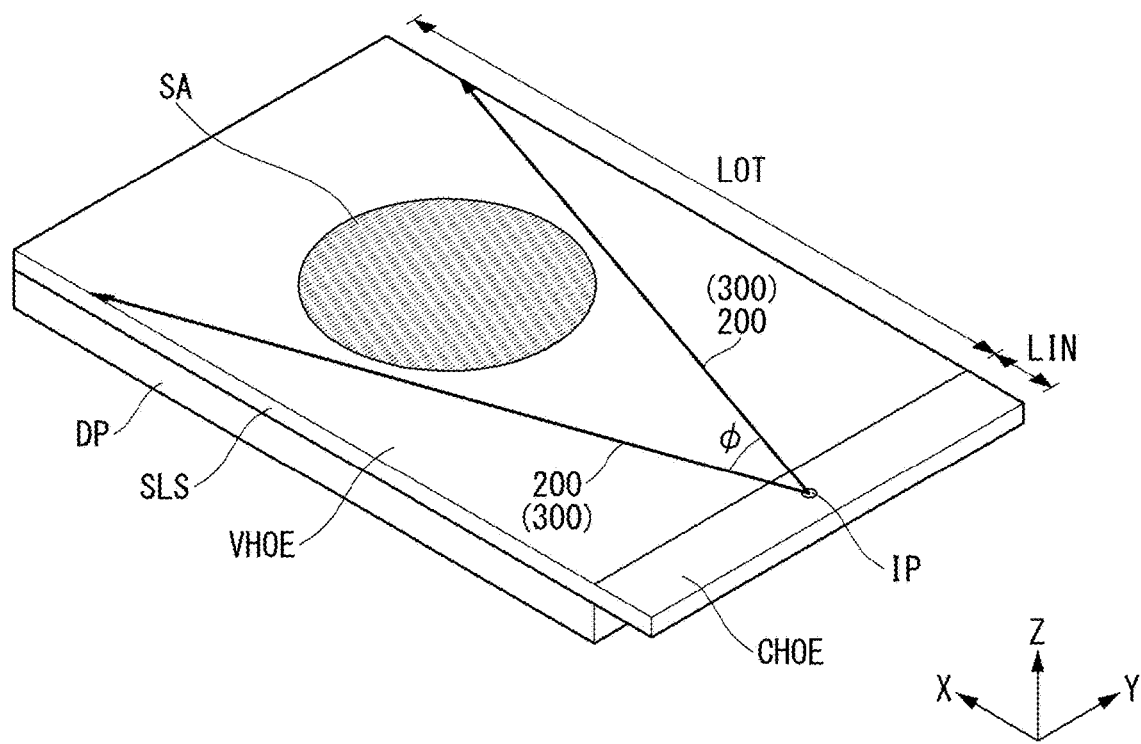

FIG. 16 is a cross-sectional view and a plane view illustrating a directional light source device SLS according to an embodiment of the present disclosure. FIG. 17 is a cross-sectional view and a plane view illustrating optical paths in the transparent substrate CP shown in FIG. 16. FIG. 18 is a cross-sectional view and a plane view illustrating the directional light source device SLS arranged on the display panel DP.

Referring to FIG. 16, the directional light source device SLS includes a transparent substrate CP, and directional light control device LS, CHOE, and VHOEs for emitting light onto the transparent substrate CP. The directional light control device LS, CHOE, and VHOE may further include a low refractive layer LR.

The directional light source device SLS is an optical device for spreading a collimated light over a large area in the transparent substrate CP. It is desirable that the light source LS provides a collimated light. The light source LS emits an infrared or visible laser beam into a light entrance element CHOE.

A light exit element VHOE and the light entrance element CHOE are attached to the bottom surface of the transparent substrate CP. The light exit element VHOE is an optical element for providing an exit light 300. Below the light exit element VHOE, a pixel array of the display panel is disposed to display an image.

The light entrance element CHOE spreads a light, collimated from the light source LS, over the transparent substrate CP to travel in parallel. The light entrance element CHOE is not directly related to image recognition, and thus it may be disposed along the edge of the display panel. The light entrance element CHOE needs to oppose the light source LS.

The light exit element VHOE and the light entrance element CHOE may be disposed on the same plane. Considering a manufacturing process, it is desirable to form the light exit element VHOE and the light entrance element CHOE in different areas of the same film. Each of the light exit element VHOE and the light entrance element CHOE may be an optical element including a holographic pattern. In this case, a mater film having a pattern of the light exit element VHIOE and a mater film having a pattern of the light entrance element CHOE may be disposed adjacent to each other, and then the two holographic patterns may be copied on a single holographic recordable film.

The low refractive layer LR may be disposed between the light exit element VHOE/the light entrance element CHOE and the display panel DP. The low refractive layer LR may have a refractive index smaller than those of the transparent substrate CP and the light exit element VHOE.

The transparent substrate CP may be manufactured with a refractive index of 1.5. The light exit element VHOE and the light entrance element CHOE are both transparent holographic recordable films, and may have a refractive index identical to or a little bit greater than a refractive index of the transparent substrate CP. Here, the light exit element VHOE and the light entrance element CHOE are described as having the same refractive index for convenience of explanation. It is desirable that the low refractive layer LR has a refractive index similar to a refractive index of a fingerprint IM, that is, human skin, which is intended to be recognized. For example, the low refractive layer LR may have a refractive index of 1.4 that is close to 1.39 which is a refractive index of human skin.

The light source LS is disposed to oppose the light entrance element CHOE. It is desirable that the light source LS provides light which is easy to collimate, such as a laser beam.

A collimated light provided from the light source LS has a specific cross section and is provided to an entrance point defined in the light entrance element CHOE. It is desirable that an incident light 190 is incident on the surface of the entrance point IP in a normal direction. However, aspects of the present disclosure are not limited thereto, and, if necessary, the incident light 190 may be incident at an angle tilted toward the normal of the surface of the entrance point IP.

The light entrance element CHOE refract the incident light 190 into a propagating light 200 having an incident angle. The incident angle desirably has a value greater than an internal total reflection critical angle of the transparent substrate CP. As a result, the propagating light 200 is totally reflected within the transparent substrate CP and propagated in a direction of X-axis which is a longitudinal direction of the transparent circuit CP.

The light exit element VHOE converts some amounts of the propagating light 200 into an exit light 300, and refracts the exit light 300 toward the top surface of the transparent substrate CP. The rest amounts of the propagating light 200 is totally reflected within the transparent substrate CP and then propagated. The exit light 300 is totally reflected from the top surface of the transparent substrate CP, but passes through the low refractive layer LR on the bottom surface of the transparent substrate CP. That is, the exit light 300 is totally reflected from the top surface of the transparent substrate CP to become a detection light (or a sensing light) 400 which passes through the bottom surface of the transparent substrate CP.

Light is propagated from the light entrance element CHOE, and the exit light 300 gradually exits from the light exit element VHOE. At this point, the quantity of exit light 300 is determined by light extraction efficiency of the light exit element VHOE. For example, if the light extraction efficiency of the light exit element VHOE is 3%, light quantity of 3% corresponding to the initial incident light 190 is extracted from a first emission area that is the first point of the light exit element VHOE touched by the propagating light 200. The rest 97% of light quantity corresponding to the propagating light 200 keeps totally reflected and is propagated. Then, in the second emission area, light quantity of 2.91%, which is 3% out of the initial incident light of 97%, is extracted as the exit light 300.

In this manner, the exit light 300 is extracted until it reaches the edge of the transparent substrate CP. To provide an exit light 300 with a constant quantity while the propagating light 200 is propagated, the light exit element VHOE needs to be designed with light extraction efficiency that increases exponentially.

When viewed on the XZ plane (or a vertical plane) consisting of the longitudinal-axis and the thickness axis, the propagating light 200 is maintained in a state where the incident light 190 is collimated. On the contrast, when the XY plane (or a horizontal plane) consisting of the width axis and the longitudinal axis, the propagating light 200 desirably has a diffusion angle. It is to set an image detection area to correspond to the area of the transparent substrate CP. For example, it is desirable to dispose the light exit element VHOE to correspond to the entire area of a light exit portion LOT. In addition, it is desirable that the diffusion angle is identical to or greater than an angle between lines connecting two end points P1 and P2 of an edge of the transparent substrate CP, the edge which opposes the light entrance element CHOE from the entrance point.

An area in which the light entrance element is disposed may be defined as a light entrance part LIN. In addition, an area in which the light exit element VHOE is disposed may be defined as a light exit part LOT. Meanwhile, the light exit part LOT may be a light-propagating part which propagates light as well.

For example, in the case where a light collimated by the light source LS has a round circle with a cross section of 0.5 mm×0.5 mm, the light entrance element CHOE may have a length corresponding to the width of the transparent substrate CP, and a width of 3 mm to 5 mm. The light entrance element CHOE may be disposed in a width direction across the transparent substrate CP.

Referring to FIG. 17, there is described which path a light collimated by the light source LS passes through in the transparent substrate CP to be converted into a directional light that is used for detection of an image.

The incident light 190 provided from the light source LS is incident on the surface of the entrance point IP of the light entrance element CHOE in a normal direction. The light entrance element CHOE converts the incident light 190 into a propagating light 200, which is refracted having an incident angle, and send the propagating light 200 into the transparent substrate CP.

It is desirable that the incident angle θ of the propagating light 200 has a value greater than a total reflection critical angle TVHOE_LR on an interface between the light exit element VHOE and the low refractive layer LR. For example, in the case where the transparent substrate CP and the light exit element VHOE has a refractive index 1.5 and the low refractive layer LR has a refractive index of 1.4, a total reflection critical angle TVHOE_LR on the interface between the light exit element VHOE and the low refractive layer LR is calculated to be approximately 69 degrees. Thus, it is desirable that the incident angle θ has a value greater than 69 degrees. For example, the incident angle θ may be set to be a value between 70 degrees and 75 degrees.

Since the top surface of the transparent substrate CP is in contact with an air layer AIR, the propagating light 200 is totally reflected from the top surface of the transparent substrate CP as well. It is because a total reflection critical angle TCP_AIR on an interface between the transparent substrate CP and the air layer AIR is approximately 41.4 degrees. That is, if the incident angle θ is greater than the total reflection critical angle TVHOE_LR on an interface between the light exit element VHOE and the low refractive layer LR, the incident angle θ is always greater than the total reflection critical angle TCP_AIR on the interface between the transparent substrate CP and the air layer AIR.

The light exit element VHOE converts a specific quantity of the propagating light 200 into an exit light 300 having a reflective angle α, and sends the exit light 300 back to the inside of the transparent substrate CP. The exit light 300 is a light used to recognize a pattern of a fingerprint IM in contact with the top surface of the transparent substrate CP. Even when there is no object on the surface of the transparent substrate CP, the exit light 300 has to be totally reflected and sent to an optical fingerprint sensor disposed below the directional light source device SLS. After being totally reflected from the top surface of the transparent substrate CP, the exit light 300 is propagated as a detection light 400 toward an area below the directional light source device SLS.

The optical fingerprint sensor attached to the bottom of the display panel may receive the detection light 400 to distinguish a fingerprint pattern image on the transparent substrate CP.

FIG. 18 is a diagram illustrating an optical path when the display panel DP is disposed below the directional light source device SLS.

Referring to FIG. 18, an incident light 190 is converted by a light entrance element CHOE into a propagating light 200. The propagating light 200 is converted to have a diffusion angle on the XY plane which is a horizontal plane consisting of the X axis, which is a longitudinal axis, and the Y axis, which is a width axis. In addition, the propagating light 200 is maintained in the initially collimated state on the XZ plane which is a vertical plane consisting of the X axis, which is the longitudinal axis, and the Z axis, which is the thickness axis.

It is desirable that the diffusion angle is identical to or greater than an internal angle formed by two lines connecting two end points of the opposite edge of the transparent substrate CP, the opposite edge which opposes the light entrance element CHOE from an entrance point IP. In this case, the propagating light 200 propagates in the form a triangle having the diffusion angle. The exit light 300 is provided over the same range of the propagating light 200. As a result, the image sensing area is the inside of the triangle. Thus, when the present disclosure is implemented as a fingerprint recognition apparatus, a sensing area SA may be set in the shaded circle.

If a sensing area SA is set at the central portion of the display panel DP or at some of the upper edge of the display panel DP opposing the light entrance element CHOE, it is desirable to design the display panel DP such that the exit light 300 has the maximum light quantity in the sensing area SA. To this end, the display panel DP may be designed based on a position function, so that light extraction efficiency of the light exit element VHOE has the maximum value in an area corresponding to the sensing area SA, and has the minimum value or a value close to 0.

As illustrated in FIG. 18, if a fingerprint touches the transparent substrate CP, light is reflected from the surface of the transparent substrate CP at a location corresponding to valley between ridge and value of the fingerprint. The reflected light passes through the light exit element VHOE and the low refractive layer LR to propagate toward the display panel DP.

Figure 20:
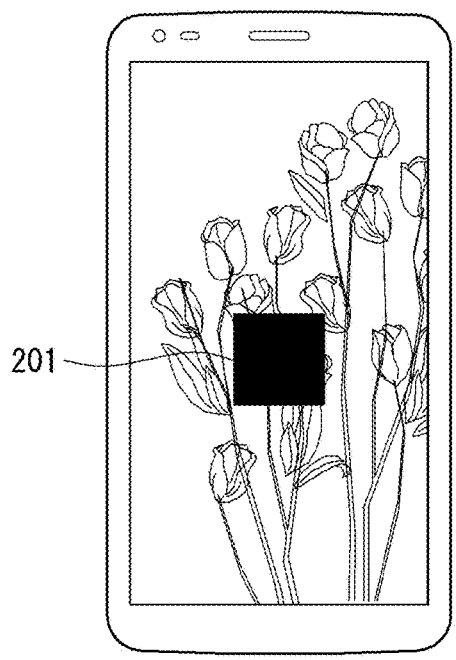
FIG. 20 is a diagram illustrating an example of a sensing area in the electroluminescent display device shown in FIG. 19.

To allow a user to easily recognize the sensing area SA shown in FIG. 18, the present disclosure may display an image indicating a location of the sensing area SA on the screen, as illustrated in FIG. 20.

Figure 19:
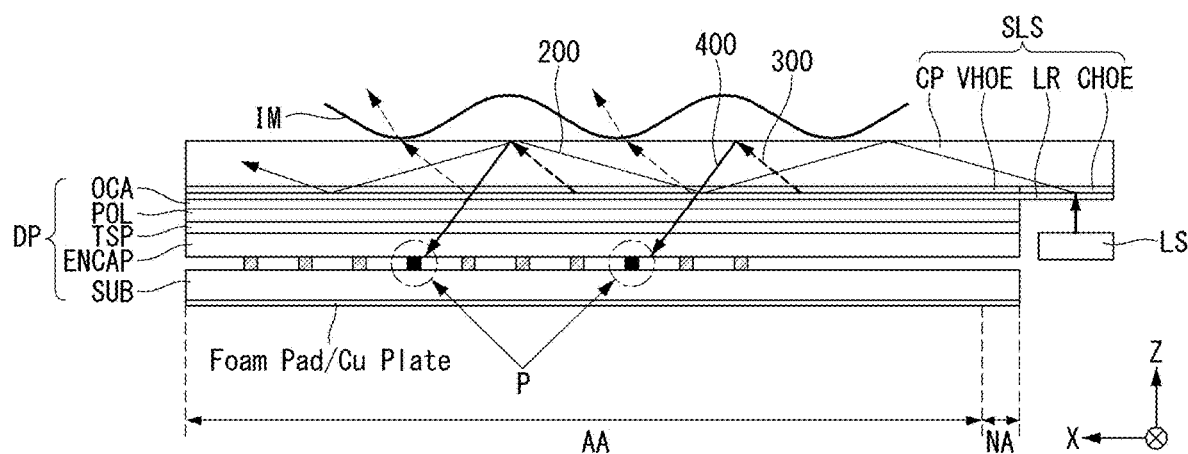
FIG. 19 is a cross-sectional view specifically illustrating a structure of a cross section of the electroluminescent display device shown in FIG. 18.

FIG. 19 is a cross-sectional view specifically illustrating a structure of a cross section of the electroluminescent display device shown in FIG. 18. FIG. 20 is a diagram illustrating an example of a sensing area in the electroluminescent display device shown in FIG. 19.

Referring to FIGS. 19 and 20, a directional light source device SLS is disposed on a display panel DP and operate as a light source in a sensor mode. The directional light source device SLS remains turned off in a display mode.

In the electroluminescent display device, all pixels P may operate as image sensors, rather than light sources, in the sensor mode. Thus, it is possible to maximize the efficiency of a sensor signal received in the ROIC 210. This display device may designate a specific area of the screen as a sensing area, for example, the sensing area SA shown in FIG. 18.

The display panel DP includes a pixel array formed on a substrate SUB, an encapsulation substrate ENCAP covering the pixel array, a touch sensor array substrate TSP disposed on the encapsulation substrate ENCAP, and a polarizing film POL attached to the touch sensor array substrate TSP. The polarizing film POL is an Optical Clear Adhesive (OCA) and attached to a low refractive layer LR of the directional light source device SLS. On the bottom surface of the substrate SUB, a foam pad and a Cu plate may be deposited. The foam pad is made of foamed resin to absorb vibration or shock. The Cu plate is a metal layer, for example, a Cu layer, which shields Electro-Magnetic Interference (EMI).

As described above, the present disclosure may implement an image sensor-embedded display panel by using pixels of a display panel as photo sensors based on the principle that a photoelectric current occurs when a reverse bias is applied to OLEDs of pixels. In addition, the present disclosure may enable sensing a fingerprint and a document image on a screen. Because additional photo sensors are not needed, the present disclosure may implement image sensors on a pixel array without any loss of the aperture ratio of the pixel array. Furthermore, because the aperture ratio of the pixel array is not reduced due to the presence of image sensors, the present disclosure may increase the freedom of design of high resolution.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An electroluminescent display device, comprising:
   a display panel having a plurality of pixels, each of the pixels including an Organic Light Emitting Diode (OLED), a driving transistor adjusting a current flowing in the OLED, a first capacitor connected to a gate of the driving transistor, and a second capacitor connected to an anode of the OLED;
   a display panel driving circuit configured to write data of an input image into the pixels during a display mode so as to display the input image with the pixels; and
   a sensor signal processing circuit configured to apply a reverse bias to the OLEDs of at least some of the pixels by adjusting a cathode voltage of the OLEDs during a sensor mode so as to process sensor signals received from the pixels,
   wherein in the display mode, a threshold voltage of the driving transistor in each of the pixels is stored in the first capacitor when the driving transistor is turned off during a display mode programming period,
   wherein the OLEDs emit light during an emission period set after the display mode programming period, and
   wherein, in the sensor mode, a sensor mode programming period is divided into a first period, in which a photo-current generated when light is received on the OLEDs is charged in the second capacitors to charge a sensor signal to the second capacitors, and a second period, in which the sensor signal charged in the second capacitors is transmitted to the sensor signal processing circuit, and
   wherein the sensor signal processing circuit includes a switch and an amplifier, the switch configured to selectively electrically couple a reference voltage to the anode of the OLEDs of the at least some of the pixels through a reference voltage line during at least a portion of the display mode, and to selectively electrically couple the amplifier to the second capacitors through the reference voltage line during the second period of the sensor mode.

2. The electroluminescent display device of claim 1, wherein the sensor signal processing circuit increases the cathode voltage of the OLEDs in the sensor mode.

3. The electroluminescent display device of claim 1, wherein the display mode programming period and the sensor mode programming period have a same duration during one horizontal period.

4. The electroluminescent display device of claim 1, wherein, in the sensor mode, OLEDs of a first portion of pixels arranged in a sensing area of the display panel emit light in response to a forward bias to thereby operate as light source pixels, and OLEDs of a second portion of pixels arranged in the sensing area operate as sensor pixels in response to the reverse bias.

5. The electroluminescent display device of claim 4, wherein locations of the light source pixels and the sensor pixels shift temporally.

6. The electroluminescent display device of claim 1, wherein the pixels are divided into M×N pixel groups (each of M and N is a positive integer equal to or greater than 3),
   wherein a pixel located at a central region of a M×N pixel group operates as a sensor pixel, and pixels surrounding the sensor pixel operate as a light source pixels, and
   wherein locations of the M×N pixel groups shift temporally.

7. The electroluminescent display device of claim 1, further comprising:
   a transparent substrate disposed on the display panel;
   a light source disposed along an edge of the transparent substrate;
   a light entrance element disposed between the light source and the transparent substrate, and configured to refract incident light into the transparent substrate as propagating light at a total reflectance angle;
   a light exit element disposed on a same plane as the light entrance element, and configured to refract part of the propagating light in the transparent substrate toward the display panel through a bottom surface of the transparent substrate; and
   a low refractive layer disposed between the light exit element and the display panel, and having a refractive index smaller than a refractive index of the light exit element and smaller than a refractive index of the transparent substrate.

8. The electroluminescent display device of claim 7, wherein the reverse bias is applied to all pixels on the display panel in the sensor mode.

9. The electroluminescent display device of claim 1, wherein the pixels sense at least one of a fingerprint pattern or a document image in the sensor mode.

10. The electroluminescent display device of claim 7, wherein the light exit element and the light entrance element are disposed on the same plane, and
    each of the light exit element and the light entrance element includes a holographic pattern.

11. The electroluminescent display device of claim 1, further comprising:
    a data driver supplying a data voltage of an input image to a plurality of data lines on the display panel; and
    a gate driver generating a scan signal, an emission control signal, and an initialization signal to be supplied to a plurality of gate lines on the display panel using a shift register.

12. The electroluminescent display device of claim 11, wherein each of the pixels further includes:
    a first switch element applying the data signal received along a respective data line to a first node in response to the scan signal, the first capacitor being connected between the first node and the gate of the driving transistor; and
    a second switch element initializing the first node to the reference voltage in response to the emission control signal.

13. The electroluminescent display device of claim 12, wherein a gate of the driving transistor is connected to a second node, a first electrode of the driving transistor is connected to a power line to be supplied with a pixel driving voltage, and a second electrode of the driving transistor is connected to a third node.

14. The electroluminescent display device of claim 13, wherein each of the pixels further includes:

a third switch element connecting the second node and the third node in response to the scan signal during the display mode programming period and the sensor mode programming period;

a fourth switch element initializing the third node to the reference voltage in response to the emission control signal; and a fifth switch element initializing the anode of the OLED to the reference voltage in response to the initialization signal.

15. The electroluminescent display device of claim 14, wherein the first switch element includes a gate connected to a first gate line to be supplied with the scan signal, a first electrode connected to the data line to be supplied with the data voltage, and a second electrode connected to the first node, the second switch element includes a gate connected to a second gate line to be supplied with the emission control signal, a first electrode connected to the first node, and a second electrode connected to the reference voltage line to be supplied with the reference voltage, the third switch element includes a gate connected to the first gate line, a first electrode connected to the gate of the driving transistor, and a second electrode connected to the second electrode of the driving transistor, the fourth switch element includes a gate connected to the second gate line, a first electrode connected to the third node, and a second electrode connected to the anode of the OLED, and the fifth switch element includes a gate connected to a third gate line to be supplied with the initialization signal, a first electrode connected to the reference voltage line, and a second electrode connected to the anode of the OLED.

16. An electroluminescent display device, comprising:

a display panel having a plurality of pixels, each of the pixels including an Organic Light Emitting Diode (OLED), a driving transistor adjusting a current flowing in the OLED, a first capacitor connected between a first node and a second node, a second capacitor connected to an anode of the OLED, and a first switch element connected between a gate electrode and a second electrode of the driving transistor, the gate electrode of the driving transistor being connected to the second node;

a display panel driving circuit configured to write data of an input image into the pixels during a display mode so as to display the input image with the pixels; and a sensor signal processing circuit configured to apply a reverse bias to the OLEDs of at least some of the pixels by adjusting a cathode voltage of the OLEDs during a sensor mode so as to process sensor signals received from the pixels, wherein, in the display mode, a threshold voltage of the driving transistor in each of the pixels is stored in the first capacitor when the driving transistor is turned off during a display mode programming period, wherein the OLEDs emit light during an emission period set after the display mode programming period, wherein, in the sensor mode, a sensor mode programming period is divided into a first period, in which a photocurrent generated when light is received on the OLEDs is charged in the second capacitors to charge a sensor signal to the second capacitors, and a second period, in which the sensor signal charged in the second capacitors is transmitted to the sensor signal processing circuit, wherein the first switch element connects the gate electrode to the second electrode during the display mode programming period and sensor mode programming period and disconnects the gate electrode from the second electrode during the emission period, and wherein the sensor signal processing circuit includes a second switch element and an amplifier, the second switch element configured to selectively electrically couple a reference voltage to the anode of the OLEDs of the at least some of the pixels through a reference voltage line during at least a portion of the display mode, and to selectively electrically couple the amplifier to the second capacitors through the reference voltage line during the second period of the sensor mode.

17. The electroluminescent display device of claim 16, wherein the sensor signal processing circuit increases the cathode voltage of the OLEDs in the sensor mode.

* * * * *